(12) United States Patent
Yamada et al.

(10) Patent No.: US 11,789,190 B2
(45) Date of Patent: Oct. 17, 2023

(54) VIEWING ANGLE CONTROL SYSTEM AND IMAGE DISPLAY DEVICE

(71) Applicant: FUJIFILM Corporation, Tokyo (JP)

(72) Inventors: Naoyoshi Yamada, Kanagawa (JP); Shinichi Yoshinari, Kanagawa (JP); Fumitake Mitobe, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 17/901,476

(22) Filed: Sep. 1, 2022

(65) Prior Publication Data

US 2023/0012512 A1    Jan. 19, 2023

Related U.S. Application Data

(63) Continuation of application No. PCT/JP2021/007880, filed on Mar. 2, 2021.

(30) Foreign Application Priority Data

Mar. 5, 2020  (JP) ................................. 2020-038038
Feb. 24, 2021 (JP) ................................. 2021-027257

(51) Int. Cl.
*G02F 1/1335* (2006.01)
*G02B 5/30* (2006.01)
(Continued)

(52) U.S. Cl.
CPC ........ *G02B 5/3016* (2013.01); *C09K 19/3861* (2013.01); *C09K 19/56* (2013.01); *G02F 1/1323* (2013.01); *G02F 1/133531* (2021.01)

(58) Field of Classification Search
CPC ............................................... G02F 1/133531
See application file for complete search history.

(56) References Cited

U.S. PATENT DOCUMENTS

2004/0080691 A1* 4/2004 Mi ....................... G02B 5/3016
                                                          349/117
2009/0153783 A1   6/2009 Umemoto
                  (Continued)

FOREIGN PATENT DOCUMENTS

JP    2009-145776 A    7/2009
JP    2010-211232 A    9/2010
                  (Continued)

OTHER PUBLICATIONS

International Search Report issued in PCT/JP2021/007880 dated May 11, 2021.
(Continued)

*Primary Examiner* — Edmond C Lau
(74) *Attorney, Agent, or Firm* — Edwards Neils LLC; Jean C. Edwards, Esq.

(57) ABSTRACT

Provided is a viewing angle control polarizing plate that has asymmetric transmission characteristics, does not cause moire even in a case of being used in combination with a high-definition image display device, and is capable of easily following a curved surface and a viewing angle control system with high productivity. The viewing angle control system includes at least a first polarizer and an optically anisotropic layer, in which an absorption axis of the first polarizer forms an angle of 45° or greater with respect to an in-plane direction, and a main axis of a refractive index of the optically anisotropic layer is tilted in the in-plane direction.

20 Claims, 6 Drawing Sheets

(51) Int. Cl.
 *C09K 19/38* (2006.01)
 *C09K 19/56* (2006.01)
 *G02F 1/13* (2006.01)

(56) References Cited

U.S. PATENT DOCUMENTS

2010/0271721 A1  10/2010  Gaides et al.
2019/0056589 A1   2/2019  Sakai
2019/0079232 A1   3/2019  Saito et al.
2020/0200958 A1   6/2020  Lee et al.

FOREIGN PATENT DOCUMENTS

| JP | 4902516 B2 | 3/2012 | |
| JP | 2012103719 A * | 5/2012 | ............ G02B 27/28 |
| JP | 6345732 B2 | 6/2018 | |
| WO | 2017/175627 A1 | 10/2017 | |
| WO | 2017/199973 A1 | 11/2017 | |
| WO | 2018/194421 A1 | 10/2018 | |

OTHER PUBLICATIONS

Written Opinion issued in PCT/JP2021/007880 dated May 11, 2021.
International Preliminary Report on Patentability completed by WIPO dated Sep. 6, 2022 in connection with International Patent Application No. PCT/JP2021/007880.

\* cited by examiner

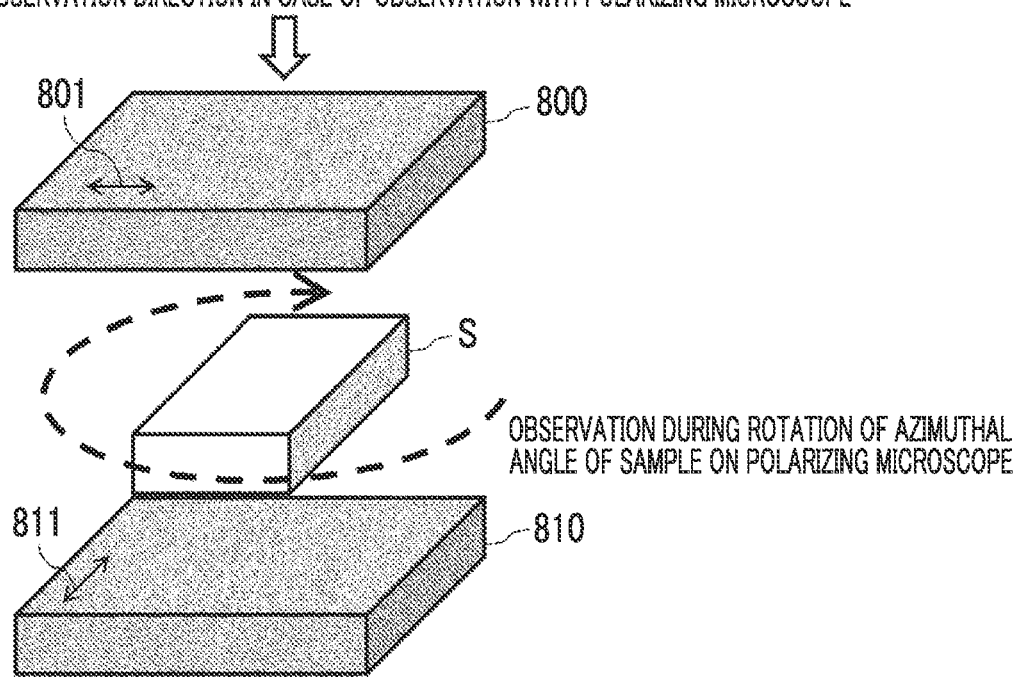

VIEWING ANGLE CONTROL SYSTEM AND IMAGE DISPLAY DEVICE

CROSS-REFERENCE TO RELATED APPLICATIONS

This application is a Continuation of PCT International Application No. PCT/JP2021/007880 filed on Mar. 2, 2021, which was published under PCT Article 21(2) in Japanese, and which claims priority under 35 U.S.C. § 119(a) to Japanese Patent Application No. 2020-038038 filed on Mar. 5, 2020 and Japanese Patent Application No. 2021-027257 filed on Feb. 24, 2021. The above applications are hereby expressly incorporated by reference, in their entirety, into the present application.

BACKGROUND OF THE INVENTION

1. Field of the Invention

The present invention relates to a viewing angle control polarizing plate including a polarizer having an absorption axis that forms an angle of 45° or greater with respect to an in-plane direction and an optically anisotropic layer in which a main axis of a refractive index is tilted with respect to the in-plane direction, a viewing angle control system, and an image display device.

2. Description of the Related Art

Image display devices such as liquid crystal display devices and organic EL display devices are frequently used as in-vehicle displays installed in automobiles. In recent years, as a result of an increase in size of in-vehicle displays, there is a problem that light emitted from the displays is reflected on the windshield, side glass, or the like and interferes with driving, and thus a technique for preventing reflected glare has been required.

In order to solve such a problem, a viewing angle control system that limits the viewing angle range of light emitted from an image display device and prevents the light from being emitted in a specific direction has been suggested.

A viewing angle control system that ensures visibility in a front direction and shields light emitted in an oblique direction is commonly used for an in-vehicle display, but in a case where the in-vehicle display is installed on a curved surface or an inclined place, the driver does not necessarily visually recognize the in-vehicle display from the front. In such a case, a viewing angle control system having asymmetric emission characteristics may be required.

Further, in a case where TV broadcasts, video contents, and the like are displayed on the in-vehicle display for the purpose of entertainment in the car, a viewing angle control system having asymmetric emission characteristics is required in some cases in order to make the display contents invisible to the driver so that the display contents do not interfere with the driving and to make the display contents only visible to the passenger in the passenger seat.

For example, JP6345732B discloses a viewing angle control system in which light transmission regions and light absorption regions are alternately arranged in the plane of a film to limit emission of light in an oblique direction with respect to a normal direction of the film. Such a viewing angle control system is usually referred to as a louver film.

Since the louver film is typically provided such that the louver is perpendicular to the in-plane direction of the film, the louver film does not shield light transmitted in the front direction and shields light emitted in an oblique direction with respect to a normal direction of the film. Meanwhile, the louver film has asymmetric transmission characteristics by allowing the louver to be inclined at an angle that is not perpendicular to the in-plane direction of the film, and therefore, an in-vehicle display having asymmetric emission characteristics can be prepared.

Further, JP4902516B discloses a viewing angle control system consisting of a laminate that includes a polarizer having an absorption axis in an in-plane direction of a film and a polarizer having an absorption axis in a range of 0° to 45° in a normal direction of the film, in which the emission angle of light is limited by decreasing the transmittance in an oblique direction with respect to a normal direction of the film.

According to JP4902516B, the absorption axis of the polarizer can be adjusted to be in a range of 0° to 45° in the normal direction of the film by applying a high-intensity electric field or the like, and thus asymmetric transmission characteristics can be obtained.

SUMMARY OF THE INVENTION

Since the light transmission regions and the light absorption regions are alternately laminated at a pitch of approximately several tens of μm in the louver film described in JP6345732B, the periodic structure interferes with the pixels of the image display device, and thus a stripe pattern referred to as moire is generated in some cases. Particularly, in recent years, since image display devices have high-definition pixels, the problem of moire has been more significant.

Further, since the louver film typically has a base material layer consisting of a polycarbonate film or the like and has a thickness of 300 μm or greater, the louver film is not easily bent. In recent years, some image display devices used as in-vehicle displays or the like have a curved display surface, and thus the louver film is difficult to apply to such image display devices.

The viewing angle control system described in JP4902516B does not have a periodic structure that interferes with the pixels of the image display device and thus can be used without the occurrence of moire. Further, in the viewing angle control system described in JP4902516B, the polarizer has a thickness of several to several tens of μm, and thus the entire thickness can be set to be small even in a case of including other base material layers. Therefore, the viewing angle control system can easily be made to follow the curved surface.

However, in the viewing angle control system described in JP4902516B, it is necessary for the absorption axis of the polarizer to be inclined at an angle that is not horizontal or perpendicular to the in-plane direction of the film in a case where the transmission characteristics are set to be asymmetric. According to the examination conducted by the present inventors, it is difficult to incline the absorption axis of the polarizer at an angle that is not horizontal or perpendicular to the in-plane direction of the film.

For example, as described in JP4902516B, the absorption axis can be inclined by using an electric field, but at this time, an extremely high electric field intensity is required, and the production equipment needs modification, which may cause a significant decrease in productivity.

Further, examples of a method of obtaining such a high electric field intensity include a method of allowing a composition that contains a dichroic coloring agent and a guest-host liquid crystal material to be sandwiched in a glass substrate provided with electrodes and applying an electric field thereto as described in JP2013-541727A, but in this case, the entire system is thickened because a glass substrate is required, and thus the system is not easy to follow a curved surface.

The present invention has been made in view of the above-described circumstances, and an object thereof is to obtain a viewing angle control polarizing plate that has asymmetric transmission characteristics, does not cause moire even in a case of being used in combination with a high-definition image display device, and is capable of easily following a curved surface and a viewing angle control system with high productivity.

As a result of the intensive examination conducted by the present inventors, it was found that the above-described object can be achieved by employing the following configurations.

<1> A viewing angle control system comprising at least: a first polarizer; an optically anisotropic layer; and a second polarizer in this order, in which an absorption axis of the first polarizer forms an angle of 45° or greater with respect to a main surface, a main axis of a refractive index of the optically anisotropic layer is tilted with respect to the main surface, and the second polarizer has an absorption axis in an in-plane direction of the main surface.

<2> The viewing angle control system according to <1>, in which the absorption axis of the first polarizer is perpendicular to a surface of the viewing angle control system.

<3> The viewing angle control system according to <1> or <2>, in which the optically anisotropic layer includes a liquid crystal cured layer in which alignment is fixed in uniform tilt alignment in a thickness direction.

<4> The viewing angle control system according to <1> or <2>, in which the optically anisotropic layer includes a liquid crystal cured layer in which alignment is fixed in hybrid alignment.

<5> The viewing angle control system according to <1> or <2>, in which the optically anisotropic layer includes a liquid crystal cured layer in which alignment is fixed in uniform tilt alignment in a thickness direction and a liquid crystal cured layer in which alignment is fixed in hybrid alignment.

<6> The viewing angle control system according to any one of <1> to <5>, in which the optically anisotropic layer consists of the liquid crystal cured layer, the liquid crystal cured layer is formed of a polymerizable liquid crystal composition containing a rod-like liquid crystal compound, and an average tilt angle of the main axis in which the refractive index is maximized is in a range of 5° to 85° with respect to the surface.

<7> The viewing angle control system according to any one of <1> to <5>, in which the optically anisotropic layer consists of the liquid crystal cured layer, the liquid crystal cured layer is formed of a polymerizable liquid crystal composition containing a disk-like liquid crystal compound, and an average tilt angle of the main axis in which the refractive index is minimized is in a range of 5 to 85° with respect to the surface.

<8> The viewing angle control system according to any one of <1> to <5>, in which the optically anisotropic layer consists of the liquid crystal cured layer, in which the liquid crystal cured layer is configured such that a product Δnd of a refractive index anisotropy Δn and a film thickness d is greater than 60 nm.

<9> An image display device comprising: the viewing angle control system according to any one of <1> to <8>.

According to the present invention, it is possible to obtain a viewing angle control polarizing plate that has asymmetric transmission characteristics, does not cause moire even in a case of being used in combination with a high-definition image display device, and is capable of easily following a curved surface and a viewing angle control system with high productivity.

BRIEF DESCRIPTION OF THE DRAWINGS

FIG. 12 is a view for describing a method of measuring the tilt angle of a main axis of the refractive index of an optically anisotropic layer.

DESCRIPTION OF THE PREFERRED EMBODIMENTS

Figure 1:
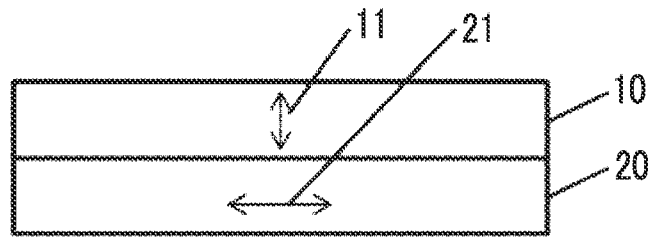
FIG. 1 is a schematic view illustrating a viewing angle control system of the related art.

Hereinafter, the present invention will be described in detail with reference to the accompanying drawings. The description of configuration requirements below may be made based on typical embodiments or specific examples, but the present invention is not limited to such embodiments.

Further, in the present specification, a numerical range shown using "to" indicates a range including numerical values described before and after "to" as a lower limit and an upper limit.

Further, in the present specification, the symbol "≈" is also used not only in a case where two elements are completely the same as each other but also in a case where two elements are substantially the same as each other.

In the present specification, the polarizing plate denotes a polarizer having at least one surface provided with a protective layer or a functional layer, and the polarizer and the polarizing plate are distinguished from each other.

In the present specification, the terms parallel and vertical do not mean parallel and vertical in a strict sense, but mean a range of parallel ±5° and a range of vertical ±5°.

In the present specification, the azimuthal angle denotes an angle formed by the azimuth of an absorption axis of a second polarizer in a plane of a film, unless otherwise specified. Further, the polar angle denotes an angle formed with the normal direction of the film.

In the present invention, refractive indices nx and ny are refractive indices in the in-plane direction of an optical member, and typically, nx represents a refractive index of a slow axis azimuth and ny represents a refractive index of a fast axis azimuth (that is, the azimuth perpendicular to the slow axis). Further, nz represents a refractive index in the thickness direction. In the present invention, the refractive indices nx, ny, and nz are measured with an Abbe refractometer (NAR-4T, manufactured by Atago Co., Ltd.) using a sodium lamp (λ=589 nm) as a light source. In a case of measuring the wavelength dependence, a multi-wavelength Abbe refractometer DR-M2 (manufactured by Atago Co., Ltd.) can be used in combination with an interference filter. In addition, values from Polymer Handbook (John Wiley & Sons, Inc.) and catalogs of various optical films can also be used.

In the present specification, Re (λ) and Rth (λ) respectively represent an in-plane retardation at a wavelength λ and a retardation at a wavelength λ in a thickness direction, and refractive indices nx, ny, and nz are represented by Equation (1) and Equation (2) using a film thickness d (μm).

$$Re(\lambda)=(nx-ny)\times d\times 1000(nm) \quad \text{Equation (1):}$$

$$Rth(\lambda)=((nx+ny)/2-nz)\times d-1000(nm) \quad \text{Equation (2):}$$

The wavelength λ is set to 550 nm unless otherwise specified.

The slow axis azimuth, Re (λ), and Rth (λ) can be measured using, for example, AxoScan OPMF-1 (manufactured by Opto Science Inc.).

(Viewing Angle Control System of Related Art)

First, the mechanism for controlling the viewing angle of the viewing angle control system of the related art described in JP4902516B will be described.

Figure 2:
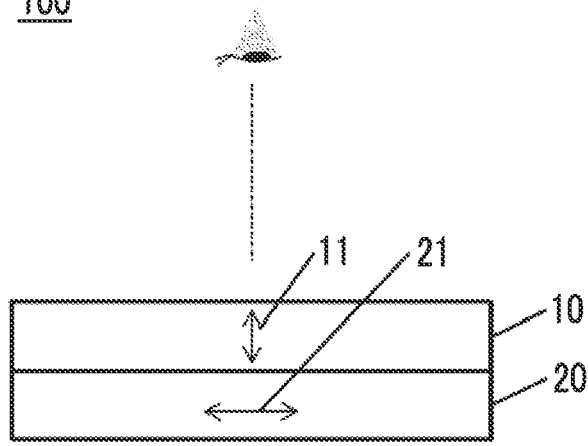
FIG. 2 is a schematic view illustrating a viewing angle control system of the related art.

FIG. 1 is a cross-sectional view illustrating a viewing angle control system 100 in which a first polarizer 10 having an absorption axis 11 in the normal direction of the film and a second polarizer 20 having an absorption axis 21 in the in-plane direction of the film are laminated. The absorption axis of the first polarizer 10 forms an angle of 90° with respect to the surface of the viewing angle control system 100 (first polarizer 10). As illustrated in FIG. 2, the second polarizer 20 absorbs a linearly polarized light component parallel to the absorption axis 21 and transmits a linearly polarized light component in a case where the viewing angle control system 100 is visually recognized from the front (that is, in the normal direction of the film). Meanwhile, since the absorption axis 11 is parallel to the visual line direction, the first polarizer 10 does not absorb light traveling in the visual line direction. Therefore, the viewing angle control system 100 transmits light.

Figure 3:
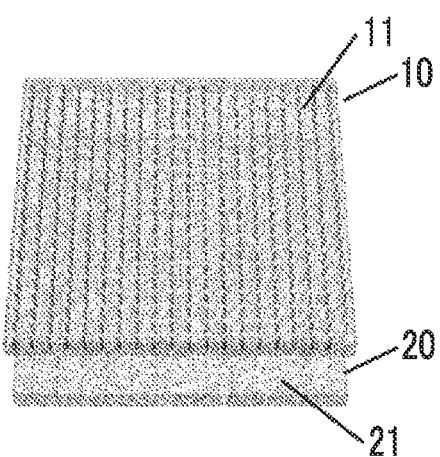
FIG. 3 is a schematic view illustrating a viewing angle control system of the related art.

FIG. 3 is a view illustrating a state in which the viewing angle control system 100 is visually recognized in an azimuth (azimuthal angle of 0°) of the absorption axis 21 in the plane of the film from an angle oblique to the normal direction of the film. However, in FIG. 3, the absorption axis 11 and the absorption axis 21 are expressed as columns and considered to be visually recognized in a front direction of the paper surface. Here, the absorption axis 11 and the absorption axis 21 are apparently parallel to each other. Among the light traveling in the visual line direction, a linearly polarized light component parallel to the absorption axis 11 and the absorption axis 21 is absorbed, and a linearly polarized light component orthogonal to the absorption axis 11 and the absorption axis 21 is transmitted. Therefore, the viewing angle control system 100 transmits light.

Figure 4:
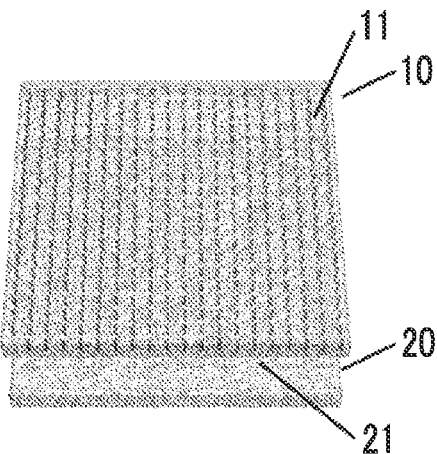
FIG. 4 is a schematic view illustrating a viewing angle control system of the related art.

Meanwhile, as illustrated in FIG. 4, in a case where the viewing angle control system 100 is visually recognized in an azimuth (azimuthal angle of 90°) perpendicular to the absorption axis 21 in the plane of the film from an angle oblique to the normal direction of the film, the absorption axis 11 and the absorption axis 21 are perpendicular to each other. In a case where light is incident in the visual line direction from the side of the first polarizer 10, first, a linearly polarized light component parallel to the absorption axis 11 is absorbed by the first polarizer 10, and a linearly polarized light component orthogonal to the absorption axis 11 is transmitted. Next, the linearly polarized light component transmitted through the first polarizer 10 is incident on the second polarizer 20, but is absorbed by the second polarizer 20 because the linearly polarized light is parallel to the absorption axis 21. Further, in a case where light is incident in the visual line direction from the side of the second polarizer 20, first, a linearly polarized light component parallel to the absorption axis 21 is absorbed, and a linearly polarized light component orthogonal to the absorption axis 21 is transmitted. The transmitted light is subsequently incident on the first polarizer 10, but is absorbed by the first polarizer 10 because the transmitted light is parallel to the absorption axis 11. Therefore, in this case, the light traveling in the visual line direction is absorbed, and the viewing angle control system 100 shields the light.

With the above-described mechanism, the viewing angle control system 100 can shield light traveling obliquely in an azimuth (azimuthal angle 90°) perpendicular to the absorption axis 21 in the plane of the film. Further, JP4902516B describes that in a case where a medium is present between the first polarizer 10 and the second polarizer 20, it is preferable that the medium does not have a retardation in order to prevent the polarization state from being substantially converted. Further, JP4902516B also describes that even in a case where the medium has a retardation, it is preferable that the in-plane retardation Re of the medium and the retardation Rth in the thickness direction are small and that the Nz coefficient of the medium is close to 1.

Figure 5:
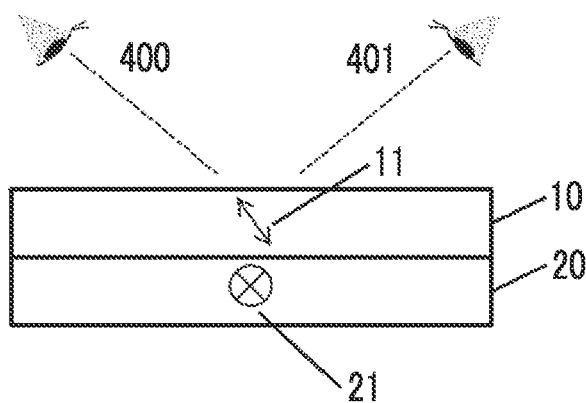
FIG. 5 is a schematic view illustrating a viewing angle control system of the related art.

Here, FIG. 5 illustrates a viewing angle control system 101 in which the absorption axis 11 of the first polarizer 10 is tilted at an angle that is not horizontal or perpendicular to the main surface of the film (first polarizer 10). In FIG. 5, the absorption axis 21 of the second polarizer 20 is in a direction perpendicular to the paper surface.

In a visual line direction 400, the absorption axis 11 of the first polarizer 10 is horizontal to the visual line direction, and thus the first polarizer 10 does not absorb light traveling in this direction (in FIG. 5, the absorption axis 11 of the first polarizer 10 and the visual line direction 400 are drawn in a manner that the absorption axis 11 and the visual line direction 400 are not horizontal to each other, but these are horizontal in consideration of the refraction of light beams traveling through the first polarizer 10). Therefore, the viewing angle control system 101 absorbs only the linearly polarized light component in a direction parallel to the absorption axis 21 of the second polarizer 20 and transmits the linearly polarized light component in a direction orthogonal to the absorption axis 21 of the second polarizer 20. Meanwhile, since the absorption axis 11 of the first polarizer 10 is perpendicular to the absorption axis 21 of the second polarizer 20 in the visual line direction 401, light traveling in this direction is absorbed by the first polarizer 10 and the second polarizer 20, and the viewing angle control system 101 shields light. In this manner, the viewing angle control system 101 in which the absorption axis 11 of the first polarizer 10 is tilted at an angle that is not horizontal or perpendicular to the in-plane direction of the film has asymmetric transmission characteristics in the lateral direction in FIG. 5.

Figure 6A:
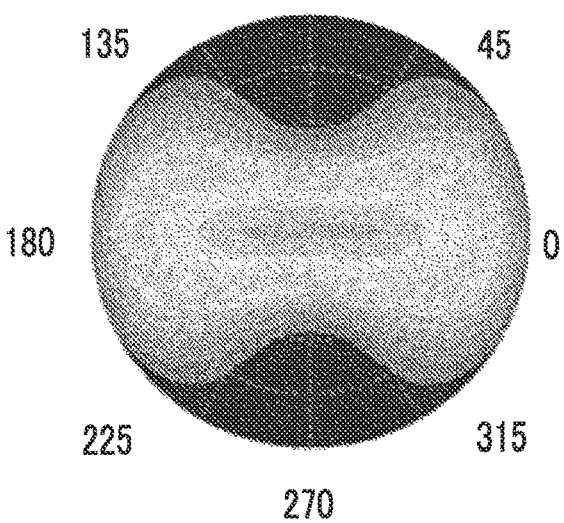
FIG. 6A is a contour view illustrating transmission characteristics of a viewing angle control system of the related art.

FIG. 6A is a contour view illustrating the transmission characteristics (the azimuthal angle and polar angle dependence of the transmittance) of the above-described viewing angle control system 100 of the related art, acquired by optical simulation. As illustrated in FIG. 6A, it can be seen that the viewing angle control system 100 has symmetric transmission characteristics in the longitudinal and lateral directions.

Figure 6B:
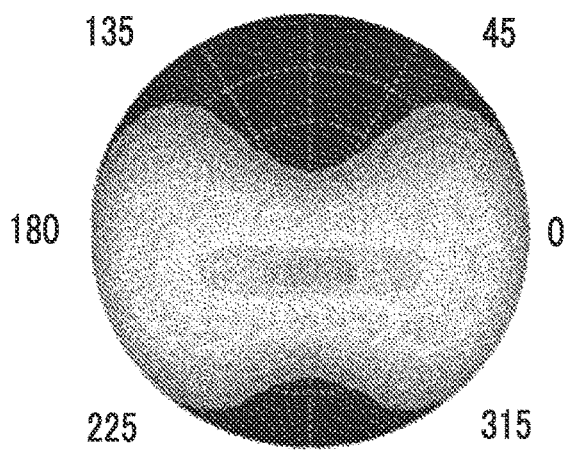
FIG. 6B is a contour view illustrating transmission characteristics of a viewing angle control system of the related art.

Further, FIG. 6B is a contour view illustrating the transmission characteristics of the above-described viewing angle control system 101 which are acquired by optical simulation. However, it is assumed that the absorption axis 11 of the first polarizer 10 is inclined by 10° with respect to the normal direction of the surface of the film. As illustrated in FIG. 6B, it can be seen that the viewing angle control system 101 has asymmetric transmission characteristics in the longitudinal direction. Meanwhile, in this case, the brightness as viewed in a direction substantially parallel to the absorption axis 11 of the first polarizer 10 (visual line direction 400) is the highest, and the front brightness is lowered.

(One Example of Viewing Angle Control Polarizing Plate and Viewing Angle Control System of Present Invention)

However, as described above, the absorption axis 11 of the first polarizer 10 is not easily tilted at an angle that is not horizontal or perpendicular to the main surface of the film.

Therefore, the present inventors conducted intensive examination on the viewing angle control system capable of achieving asymmetric transmission characteristics even in a case where the absorption axis 11 of the first polarizer 10 is perpendicular to the main surface of the film, thereby completing the present invention. Further, the main surface in the present invention denotes the maximum surface of the film-like material.

Figure 7A:
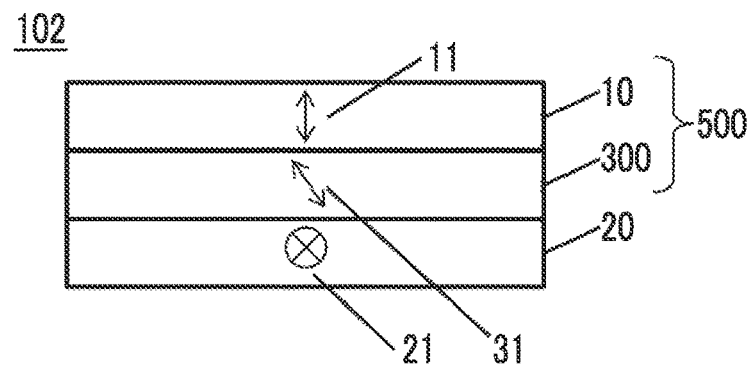
FIG. 7A is a schematic view illustrating an example of the viewing angle control system of the present invention.

FIG. 7A is a schematic view illustrating an example of the viewing angle control system according to the embodiment of the present invention.

A viewing angle control system 102 illustrated in FIG. 7A includes a viewing angle control polarizing plate 500 having the first polarizer 10 and an optically anisotropic layer 300, and the second polarizer 20.

The viewing angle control polarizing plate 500 is formed by laminating at least the first polarizer 10 having the absorption axis 11 in the normal direction of the film and an optically anisotropic layer 300. In the illustrated example, the absorption axis 11 of the first polarizer 10 forms an angle of 90° with respect to the surface of the viewing angle control system 102 (first polarizer 10). The optically anisotropic layer 300 may be a single-layer optical member or may be a layer formed by laminating a plurality of layers. Further, in the optically anisotropic layer 300, a main axis 31 of the refractive index is tilted in the in-plane direction of the main surface, and the tilt azimuth is perpendicular to the azimuth of the absorption axis 21 of the second polarizer 20 (azimuthal angle of 270°). In the following description, the azimuthal direction of the main axis as viewed in a direction perpendicular to the surface of the optically anisotropic layer is also referred to as a tilt azimuth.

The viewing angle control polarizing plate 500 can construct the viewing angle control system 102 according to the embodiment of the present invention by being laminated with the second polarizer 20 having the absorption axis 21 in the in-plane direction of the film. That is, the viewing angle control system 102 includes at least the optically anisotropic layer 300 between the first polarizer 10 and the second polarizer 20.

Figure 7B:
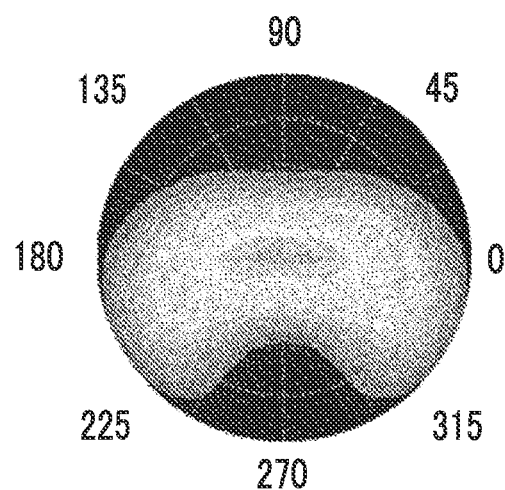
FIG. 7B is a contour view illustrating transmission characteristics of the viewing angle control system of FIG. 7A.

As an example, the transmission characteristics acquired by optical simulation are illustrated in FIG. 7B on the assumption that the optically anisotropic layer 300 is formed of a rod-like liquid crystal compound, the average tilt angle of the main axis in which the refractive index is maximized is 70° with respect to the surface of the viewing angle control system 102 (optically anisotropic layer 300), and the product $\Delta$nd of the refractive index anisotropy $\Delta$n and the film thickness d of the rod-like liquid crystal compound is 300 nm. As illustrated in FIG. 7B, it can be seen that the viewing angle control system 102 has asymmetric transmission characteristics in the longitudinal direction (that is, with respect to the axis connecting 0° and 180° in a range of 0° to 90° to 180° and a range of 0° to 270° to 180°) even though the absorption axis 11 of the first polarizer 10 is not tilted.

(Another Example of Viewing Angle Control Polarizing Plate and Viewing Angle Control System According to Embodiment of Present Invention)

Figure 8A:
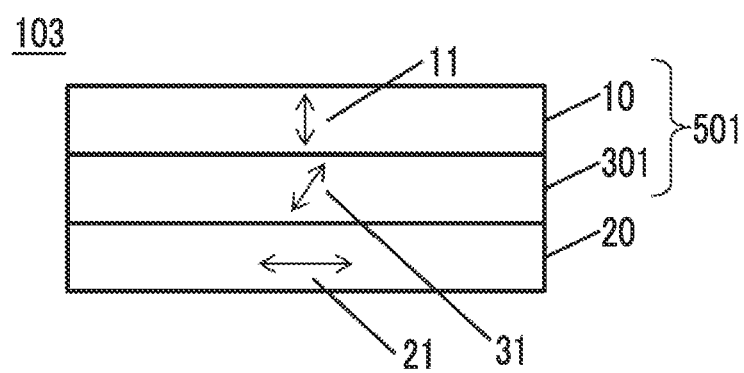
FIG. 8A is a schematic view illustrating another example of the viewing angle control system of the present invention.

FIG. 8A is a schematic view illustrating another example of the viewing angle control polarizing plate and the viewing angle control system according to the embodiment of the present invention.

A viewing angle control polarizing plate 501 is formed by laminating at least the first polarizer 10 having the absorption axis 11 in the normal direction of the film and an optically anisotropic layer 301. Further, in the optically anisotropic layer 301, the main axis 31 of the refractive index is tilted in the in-plane direction, and the tilt azimuth is parallel to the azimuth of the absorption axis 21 of the second polarizer 20 (azimuthal angle of 0°).

The viewing angle control polarizing plate 501 can construct a viewing angle control system 103 according to the embodiment of the present invention by being laminated with the second polarizer 20 having the absorption axis 21 in the in-plane direction of the film. That is, the viewing angle control system 103 includes at least the optically anisotropic layer 301 between the first polarizer 10 and the second polarizer 20.

Figure 8B:
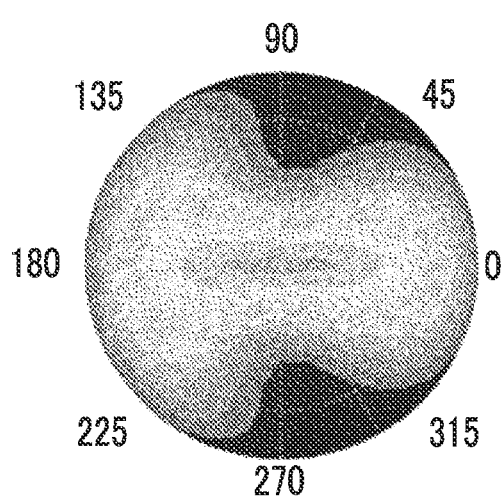
FIG. 8B is a contour view illustrating transmission characteristics of the viewing angle control system of FIG. 8A.

As an example, the transmission characteristics acquired by optical simulation are illustrated in FIG. 8B on the assumption that the optically anisotropic layer 301 is formed of a rod-like liquid crystal compound, the average tilt angle of the main axis in which the refractive index is maximized is 80° with respect to the in-plane direction, and the product $\Delta$nd of the refractive index anisotropy $\Delta$n and the film thickness d of the rod-like liquid crystal compound is 300 nm. As illustrated in FIG. 8B, it can be seen that the viewing angle control system 103 has asymmetric transmission characteristics in the lateral direction (that is, with respect to the axis connecting 90° and 270° in a range of 90° to 0° to 270° and a range of 90° to 180° to 270°).

Hereinafter, an optical member that can be used in the viewing angle control system according to the embodiment of the present invention will be described in detail.

(First Polarizer)

The first polarizer in the present invention is configured such that the direction of the absorption axis forms an angle of 45° or greater with respect to the main surface.

In order to increase the productivity of the first polarizer, it is preferable that the direction of the absorption axis of the first polarizer is perpendicular to the main surface (that is, the direction coincides with the normal direction of the film). In a case where the absorption axis is perpendicular to the main surface, the first polarizer can be obtained by a method as described later without using a high-intensity electric field or the like.

For example, in a case where the viewing angle control system is used to prevent peeping into an image display device, it is preferable to maximize the transmittance in the front direction. In this case, the direction of the absorption axis of the first polarizer may be made to coincide with the normal direction of the film so that the direction thereof is perpendicular to the surface.

[Light Absorption Anisotropic Layer]

The first polarizer in the present invention can have a light absorption anisotropic layer in which at least one dichroic substance is aligned perpendicular to the film surface. The light absorption anisotropic layer can also contain a plurality of kinds of dichroic substances. For example, it is preferable that the light absorption anisotropic layer contains a cyan coloring agent exhibiting a dichroic property in a wavelength range of a red color, a magenta coloring agent exhibiting the dichroic property in a wavelength range of a green color, and a yellow coloring agent exhibiting the dichroic property in a wavelength range of a blue color. In a case where the light absorption anisotropic layer contains a plurality of kinds of dichroic substances, the tint can be made neutral and the viewing angle control effect can be exhibited over the entire wavelength range of visible light.

Further, the dichroic substance is a substance exhibiting the dichroic property, and the dichroic property denotes a property in which the absorbance varies depending on the polarization direction.

The degree of alignment of the dichroic substance at a wavelength of 550 nm is preferably 0.95 or greater. In a case where the degree of alignment of the dichroic substance is 0.95 or greater, the transmittance in the direction of the absorption axis (that is, the direction in which light is expected to be transmitted) can be increased. Further, from the viewpoint of making the tint neutral, the degree of alignment of the dichroic substance at a wavelength of 420 nm is preferably 0.93 or greater.

The thickness of the light absorption anisotropic layer is not particularly limited, but is preferably in a range of 100 to 8000 nm and more preferably in a range of 300 to 5000 nm from the viewpoint of the flexibility.

[Dichroic Substance]

The dichroic substance used in the present invention is not particularly limited as long as the dichroic substance is a substance exhibiting the dichroic property, and examples thereof include a dichroic coloring agent, a dichroic azo compound, an ultraviolet absorbing substance, an infrared absorbing substance, a nonlinear optical substance, carbon nanotubes, anisotropic metal nanoparticles, and an inorganic substance. A dichroic azo coloring agent compound is particularly preferable as the dichroic substance.

The dichroic azo coloring agent compound used in the present invention is not particularly limited, and a known dichroic azo coloring agent of the related art can be used. The dichroic azo coloring agent compound may or may not exhibit liquid crystallinity. In a case where the dichroic azo coloring agent compound exhibits liquid crystallinity, the dichroic azo coloring agent compound may exhibit any of nematic liquid crystallinity or smectic liquid crystallinity. The temperature at which the liquid crystal phase is exhibited is preferably in a range of room temperature (approximately 20° C. to 28° C.) to 300° C. and from the viewpoints of handleability and manufacturing suitability, more preferably in a range of 50° C. to 200° C.

In the present invention, from the viewpoint of further enhancing pressing resistance, it is preferable that the dichroic azo coloring agent compound contains a crosslinkable group. Specific examples of the crosslinkable group include a (meth)acryloyl group, an epoxy group, an oxetanyl group, and a styryl group. Among these, a (meth)acryloyl group is preferable.

In a case where the dichroic substance is anisotropic metal nanoparticles, it is preferable that the material of the anisotropic metal nanoparticles is at least one selected from gold, silver, copper, or aluminum.

[Liquid Crystal Compound]

The light absorption anisotropic layer in the first polarizer may contain a liquid crystal compound. In a case where the light absorption anisotropic layer contains a liquid crystal compound, the dichroic substances can be aligned with a high degree of alignment while the precipitation of the dichroic substances is suppressed.

As the liquid crystal compound, any of a low-molecular-weight liquid crystal compound or a polymer liquid crystal compound can also be used, and it is preferable that both are used in combination. Here, the "low-molecular-weight liquid crystal compound" indicates a liquid crystal compound having no repeating units in the chemical structure. Here, "polymer liquid crystal compound" denotes a liquid crystal compound having a repeating unit in the chemical structure.

Examples of the low-molecular-weight liquid crystal compound include liquid crystal compounds described in JP2013-228706A.

Examples of the polymer liquid crystal compound include thermotropic liquid crystal polymers described in JP2011-237513A. Further, from the viewpoint of enhancing the strength (particularly, the bending resistance of the film), it is preferable that the polymer liquid crystal compound has a repeating unit containing a crosslinkable group at the terminal. Examples of the crosslinkable group include the polymerizable groups described in paragraphs [0040] to [0050] of JP2010-244038A. Among these, from the viewpoint of improving the reactivity and the synthetic suitability, an acryloyl group, a methacryloyl group, an epoxy group, an oxetanyl group, and a styryl group are preferable, and an acryloyl group and a methacryloyl group are more preferable.

In a case where the light absorption anisotropic layer contains a polymer liquid crystal compound, it is preferable that the polymer liquid crystal compound forms a nematic liquid crystal phase. The temperature at which the nematic liquid crystal phase is exhibited is preferably in a range of room temperature (23° C.) to 450° C. and more preferably in a range of 50° C. to 400° C. from the viewpoints of handleability and manufacturing suitability.

The content of the liquid crystal compound in the light absorption anisotropic layer is preferably in a range of 25 to 2000 parts by mass, more preferably in a range of 100 to 1300 parts by mass, and still more preferably in a range of 200 to 900 parts by mass with respect to 100 parts by mass of the content of the dichroic substances. In a case where the content of the liquid crystal compound is in the above-described ranges, the degree of alignment of the dichroic substance is further improved.

The liquid crystal composition may contain only one or two or more kinds of liquid crystal compounds. In a case where the liquid crystal composition contains two or more kinds of liquid crystal compounds, the content of the liquid crystal compounds indicates the total content of the liquid crystal compounds.

[Additive]

The light absorption anisotropic layer in the first polarizer may further contain additives such as a solvent, a vertical alignment agent, an interface improver, a leveling agent, a polymerizable component, a polymerization initiator (for example, a radical polymerization initiator), and a durability improver. Known additives can be appropriately used as the additives.

[Base Material Layer]

The first polarizer may have a base material layer.

The base material layer is not particularly limited, but a transparent film or a transparent sheet is preferable, and examples thereof include known transparent resin films, transparent resin plates, transparent resin sheets, and glass. Examples of the transparent resin films include a cellulose acylate film (such as a cellulose triacetate film, a cellulose diacetate film, a cellulose acetate butyrate film, and a cellulose acetate propionate film), a polyethylene terephthalate film, a polyether sulfone film, a polyacrylic resin film, a polyurethane-based resin film, a polyester film, a polycarbonate film, a polysulfone film, a polyether film, a polymethylpentene film, a polyether ketone film, and a (meth) acrylonitrile film.

Among these, a cellulose acylate film which is highly transparent, has a small optical birefringence, is easily produced, and is typically used as a protective film of a polarizing plate is preferable, and a cellulose triacetate film is particularly preferable.

The thickness of the transparent base material film is preferably in a range of 20 μm to 100 μm.

[Alignment Film]

The first polarizer may have an alignment film between the base material layer and the light absorption anisotropic layer.

The alignment film may be any layer as long as the dichroic substance can be in a desired alignment state on the alignment film.

For example, a film formed of a polyfunctional acrylate compound or polyvinyl alcohol may be used. Polyvinyl alcohol is particularly preferable.

[Barrier Layer]

It is preferable that the first polarizer has a barrier layer together with the light absorption anisotropic layer.

Here, the barrier layer is also referred to as a gas barrier layer (oxygen barrier layer) and has a function of protecting the polarizer of the present invention from gas such as oxygen in the atmosphere, the moisture, or the compound contained in an adjacent layer.

The barrier layer can refer to, for example, the description in paragraphs [0014] to [0054] of JP2014-159124A, paragraphs [0042] to [0075] of JP2017-121721A, paragraphs [0045] to [0054] of JP2017-115076A, paragraphs [0010] to [0061] of JP2012-213938A, and paragraphs [0021] to [0031] of JP2005-169994A.

[Refractive Index Adjusting Layer]

In the first polarizer, the above-described light absorption anisotropic layer contains a dichroic substance, and internal reflection due to the high refractive index of the light absorption anisotropic layer may be a problem. In that case, it is preferable that the refractive index adjusting layer is present. The refractive index adjusting layer is a refractive index adjusting layer that is disposed to be in contact with the light absorption anisotropic layer and performs so-called index matching, and the in-plane average refractive index at a wavelength of 550 nm is preferably 1.55 or greater and 1.70 or less.

[Method of Forming Light Absorption Anisotropic Layer]

A method of forming the light absorption anisotropic layer is not particularly limited, and examples thereof include a method of sequentially performing a step of applying a composition for forming a light absorption anisotropic layer to form a coating film (hereinafter, also referred to as "coating film forming step") and a step of aligning the liquid crystal component and the dichroic substance contained in the coating film (hereinafter, also referred to as "aligning step").

Further, the liquid crystal component is a component that also includes a dichroic substance having liquid crystallinity in a case where the above-described dichroic substance has liquid crystallinity, in addition to the above-described liquid crystal compound.

[Coating Film Forming Step]

The coating film forming step is a step of applying a composition for forming a light absorption anisotropic layer to form a coating film.

The composition for forming a light absorption anisotropic layer can be easily applied by using the composition for forming a light absorption anisotropic layer which contains a solvent or using a liquid such as a melt obtained by heating the composition for forming a light absorption anisotropic layer.

Examples of the method of applying the composition for forming a light absorption anisotropic layer include known methods such as a roll coating method, a gravure printing method, a spin coating method, a wire bar coating method, an extrusion coating method, a direct gravure coating method, a reverse gravure coating method, a die coating method, a spraying method, and an ink jet method.

[Aligning Step]

The aligning step is a step of aligning the liquid crystal component contained in the coating film. In this manner, a light absorption anisotropic layer is obtained.

The aligning step may include a drying treatment. Components such as a solvent can be removed from the coating film by performing the drying treatment. The drying treatment may be performed by a method of allowing the coating film to stand at room temperature for a predetermined time (for example, natural drying) or a method of heating the coating film and/or blowing air to the coating film.

Here, the liquid crystal component contained in the composition for forming a light absorption anisotropic layer may be aligned by the coating film forming step or the drying treatment described above. For example, in an aspect in which the composition for forming a light absorption anisotropic layer is prepared as a coating solution containing a solvent, a coating film having light absorption anisotropy (that is, a light absorption anisotropic film) is obtained by drying the coating film and removing the solvent from the coating film.

In a case where the drying treatment is performed at a temperature higher than or equal to the transition temperature of the liquid crystal component contained in the coating film from a liquid crystal phase to an isotropic phase, the heat treatment described below may not be performed.

The transition temperature of the liquid crystal component contained in the coating film from a liquid crystal phase to an isotropic phase is preferably in a range of 10° C. to 250° C. and more preferably in a range of 25° C. to 190° C. from the viewpoint of the manufacturing suitability or the like. It is preferable that the transition temperature is 10° C. or higher from the viewpoint that a cooling treatment or the like for lowering the temperature to a temperature range in which a liquid crystal phase is exhibited is not necessary. Further, it is preferable that the transition temperature is 250° C. or lower from the viewpoint that a high temperature is not required even in a case where the coating film is heated until the phase transition to the isotropic phase is made for the purpose of suppressing alignment defects and waste of heat energy and deformation and deterioration of the substrate can be reduced.

It is preferable that the aligning step includes a heat treatment. In this manner, since the liquid crystal component contained in the coating film can be aligned, the coating film after being subjected to the heat treatment can be suitably used as the light absorption anisotropic film.

From the viewpoint of the manufacturing suitability, the heat treatment is performed at a temperature of preferably 10° C. to 250° C. and more preferably 25° C. to 190° C. Further, the heating time is preferably in a range of 1 to 300 seconds and more preferably in a range of 1 to 60 seconds.

The aligning step may include a cooling treatment performed after the heat treatment. The cooling treatment is a treatment of cooling the coating film after being heated to room temperature (20° C. to 25° C.). In this manner, the alignment of the liquid crystal component contained in the coating film can be fixed. The cooling means is not particularly limited and can be performed according to a known method.

[Other Steps]

The method of forming the light absorption anisotropic layer may include a step of curing the light absorption anisotropic layer after the aligning step (hereinafter, also referred to as a "curing step").

The curing step is performed by heating the light absorption anisotropic layer and/or irradiating the layer with light (exposing the layer to light), for example, in a case where the light absorption anisotropic layer contains a crosslinkable group (polymerizable group). From the viewpoint of the productivity, it is preferable that the curing step is performed by light irradiation.

Various light sources such as infrared rays, visible light, and ultraviolet rays can be used as the light source for curing, but ultraviolet rays are preferable. In addition, ultraviolet rays may be applied while the film is heated during curing, or ultraviolet rays may be applied through a filter that transmits light having only a specific wavelength.

In a case where the exposure is performed while the film is heated, the heating temperature during the exposure depends on the transition temperature of the liquid crystal component contained in the liquid crystal film, but is preferably in a range of 25° to 140° C.

Further, the exposure may be performed under a nitrogen atmosphere. In a case where the curing of the liquid crystal film proceeds by radical polymerization, from the viewpoint of reducing inhibition of polymerization by oxygen, it is preferable that exposure is performed in a nitrogen atmosphere.

(Other Forms of First Polarizer)

The first polarizer may be a polarizer that contains a dichroic coloring agent and a guest-host liquid crystal material and can electrically drive the alignment direction of the dichroic coloring agent, as described in, for example, JP2013-541727A. In this case, a state in which the viewing angle is limited and a state in which the viewing angle is not limited can be electrically switched to each other, which is preferable.

(Optically Anisotropic Layer)

The optically anisotropic layer in the present invention is provided between the first polarizer and the second polarizer. The optically anisotropic layer is formed of one layer or two or more layers, but in the present invention, it is preferable that the optically anisotropic layer is formed of one or two layers.

From the viewpoint of reducing the thickness of the viewing angle control system, it is preferable that the thickness of the optically anisotropic layer is small as long as the optical characteristics, the mechanical properties, and the manufacturing suitability are not impaired, and specifically, the thickness thereof is preferably in a range of 1 to 150 µm, more preferably in a range of 1 to 70 µm, and still more preferably in a range of 1 to 30 µm.

From the viewpoint of ease of production or the like, it is preferable that the optically anisotropic layer includes a polymer film or a liquid crystal cured layer formed of a liquid crystal compound.

As the polymer film, a cellulose acylate-based film, a cycloolefin-based polymer film (a polymer film formed of a cycloolefin-based polymer), a polycarbonate-based polymer film, a polystyrene-based polymer film, or an acrylic polymer film is preferable. It is preferable that the acrylic polymer film contains an acrylic polymer having at least one unit selected from a lactone ring unit, a maleic acid anhydride unit, or a glutaric anhydride unit.

The optically anisotropic layer in the present invention is configured such that the main axis of the refractive index is tilted in the in-plane direction.

Further, the main axis of the refractive index denotes one of the main axes of the refractive index ellipsoid of the optically anisotropic layer. In a case where the optically anisotropic layer is a liquid crystal cured layer, a molecule or an aggregate of molecules typically has rotational symmetry, and the refractive index ellipsoid has uniaxial symmetry. Here, a symmetric axis of the refractive index ellipsoid is one of the main axes of the refractive index.

The tilt azimuth and the tilt angle of the main axis of the refractive index of the optically anisotropic layer can be measured by, for example, the following method.

First, a method of measuring the tilt azimuth of the optically anisotropic layer (azimuthal direction of the main axis as viewed in a direction perpendicular to the surface) will be described. The optically anisotropic layer is set between a polarizer and an analyzer of a polarizing microscope, and absorption axes of the polarizer and the analyzer are arranged to be orthogonal to each other. Next, the stage on which the optically anisotropic layer is placed is allowed to rotate to search the azimuth in which transmitted light is darkest while looking into a polarizing microscope. In the arrangement, it can be estimated that the tilt azimuth of the optically anisotropic layer coincides with the azimuth of the absorption axis of the polarizer or the analyzer of the polarizing microscope. For convenience, these two azimuths will be referred to as an azimuth A and an azimuth B. Next, the optically anisotropic layer is set on a stage of a polarimeter AxoScan OPMF-1 (manufactured by Axometrics Inc.), light beams for measurement are allowed to be incident at various polar angles in the azimuth A, and the retardation is measured. Here, in a case where a polar angle at which the retardation is zero is present, it can be identified that the azimuth A is the tilt azimuth of the optically anisotropic layer. Similarly, in a case where a polar angle at which the retardation is zero is present during the incidence of light beams for measurement at various polar angles in the azimuth B, it can be identified that the azimuth B is the tilt azimuth of the optically anisotropic layer.

Figure 11:
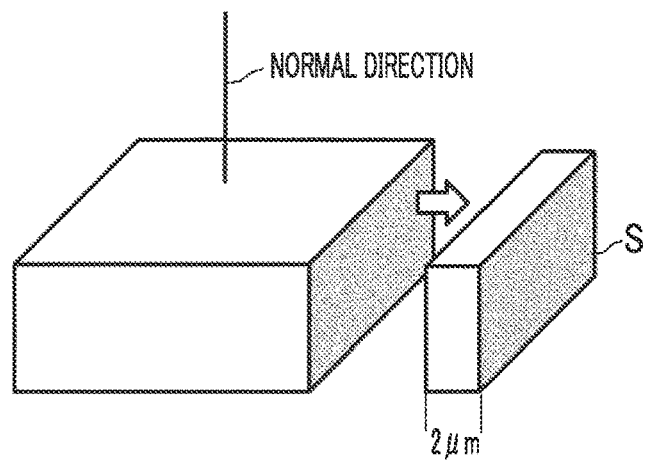
FIG. 11 is a view for describing a method of measuring the tilt angle of a main axis of the refractive index of an optically anisotropic layer.

Next, a method of measuring the tilt angle of the optically anisotropic layer will be described. In the above-described method, the polar angle at which the retardation is zero reflects the tilt angle of the optically anisotropic layer, but the refraction of the light beams incident on the optically anisotropic layer needs to be considered in order to know the exact tilt angle. The tilt angle can be calculated from the refraction angle in a case where the refractive index of the optically anisotropic layer is known, but the accurate tilt angle can be acquired by the following method in a case where the refractive index is not known. That is, as illustrated in FIG. 11, the optically anisotropic layer is cut perpendicularly to the main surface in the tilt azimuth identified by the above-described method using a microtome, and a section S having a thickness of 2 µm is collected. As illustrated in FIG. 12, the obtained section S is set sideways on a stage of a polarizing microscope in which absorption axes 811 and 801 of a polarizer 810 and an analyzer 800 are arranged to be orthogonal to each other, the stage on which the section S has been placed is allowed to rotate, and the azimuth at which the transmitted light is the darkest while looking into the polarizing microscope. In the arrangement, it can be estimated that the tilt angle of the optically anisotropic layer coincides with the azimuth of the absorption axis of the polarizer 810 or the analyzer 801 of the polarizing microscope. Between the two azimuth, it can be identified that the azimuth close to the polar angle at which the retardation is zero, which is acquired by the above-described method, can be identified as the tilt angle.

The tilt azimuth of the main axis of the refractive index in the optically anisotropic layer may be any azimuth. For example, in a case where the tilt azimuth is perpendicular to the absorption axis of the second polarizer as viewed in the front direction, that is, in a case where the tilt azimuthal angle is 90° or 270°, the viewing angle control system has asymmetric transmission characteristics with respect to axes at azimuthal angles of 0° and 180°. Further, in a case where the tilt azimuth is parallel to the absorption axis of the second polarizer as viewed in the front direction, that is, in a case where the tilt azimuthal angle is 0° or 180°, the viewing angle control system has asymmetric transmission characteristics with respect to axes at azimuthal angles of 90° and 270°.

In a case where the optically anisotropic layer is a liquid crystal cured layer, tilting of the main axis of the refractive index with respect to the main surface can be realized by inclining the alignment of the liquid crystal compound. The liquid crystal compound may be configured to be uniformly inclined in the film thickness direction or at least a part of the liquid crystal compounds may be tilt-aligned.

As an example in which a part of the liquid crystal compound is tilt-aligned, the liquid crystal compound may be fixed in a so-called hybrid alignment state. In the hybrid alignment, the angle between the major axis of the liquid crystal compound and the layer surface increases or decreases with an increase in distance from the alignment film surface in the depth direction of the layer. A change in angle can be a continuous increase, a continuous decrease, an intermittent increase, an intermittent decrease, a change including a continuous increase and a continuous decrease, or an intermittent change including an increase and a decrease. The intermittent change includes a region where the angle does not change in the middle of the thickness direction. In the present specification, the term "hybrid alignment" includes a case where the change includes a region where the angle does not change and a case where the change in angle increases or decreased as a whole.

Further, the optically anisotropic layer may be configured to include a liquid crystal cured layer in which the alignment is fixed in uniform tilt alignment in the thickness direction and a liquid crystal cured layer in which the alignment is fixed in hybrid alignment.

[Optically Anisotropic Layer Formed of Liquid Crystal Compound]

It is preferable that the viewing angle control system includes, as the optically anisotropic layer formed of a liquid crystal compound, a liquid crystal cured layer in which a liquid crystal compound is fixed in an alignment state. Among examples, it is more preferable that the viewing angle control system includes a liquid crystal cured layer obtained by applying a composition containing a liquid crystal compound that contains a polymerizable group to form a coating film, aligning the liquid crystal compound in the coating film, and performing a curing treatment so that the alignment of the liquid crystal compound is fixed.

Examples of the liquid crystal compound include a rod-like liquid crystal compound and a disk-like liquid crystal compound, and it is preferable that the liquid crystal compound contains a polymerizable group for fixing the alignment state.

The optically anisotropic layer formed of the liquid crystal compound is advantageous for reducing the thickness, and the thickness thereof is also easily set to 10 µm or less.

The liquid crystal cured layer is formed by allowing the polymerizable liquid crystal composition to enter a desired alignment state and curing the composition. For example, the liquid crystal cured layer can be prepared by directly coating a base material with the polymerizable liquid crystal composition or coating an alignment treatment surface of an alignment film provided on the base material with the composition, aligning the base material in a direction of the alignment treatment, and fixing the alignment in the alignment state. A known base material can be used as the base material, and examples thereof include of the base material include polyester such as polyethylene terephthalate (PET), polycarbonates, an acrylic resin, an epoxy resin, polyurethanes, polyamide, polyolefin, a cycloolefin resin, and a cellulose derivative. In a case where the base material is directly coated with the composition, an alignment restricting force can be applied to the surface of the base material by rubbing the surface, irradiating the surface with polarized light, or stretching the entire base material.

[Alignment Film]

Examples of the alignment film include a rubbed film formed of an organic compound such as a polymer, an obliquely deposited film of an inorganic compound, a film having microgrooves, and a film obtained by accumulating LB (Langmuir-Blodgett) films formed of an organic compound such as w-tricosanoic acid, dioctadecylmethylammonium chloride, or methyl stearate using the Langmuir-Blodgett method. Other examples thereof include a photo-alignment film in which an alignment function is generated by irradiation with light.

As the alignment film, a film formed by performing a rubbing treatment on the surface of a layer (polymer layer) containing an organic compound such as a polymer can be preferably used. The rubbing treatment is carried out by rubbing the surface of the polymer layer with paper or cloth several times in a certain direction (preferably in the longitudinal direction of the support). Preferred examples of the polymer used for forming the alignment film include polyimide, polyvinyl alcohol, the modified polyvinyl alcohol described in paragraphs [0071] to [0095] of JP3907735B, and the polymer containing a polymerizable group described in JP polymerization described in JP1997-152509A (JP-H9-152509A).

It is also preferable to use a so-called photo-alignment film (photo-alignment layer) which is an alignment layer obtained by irradiating a photo-alignment material with polarized light or non-polarized light.

In the present invention, it is preferable that the alignment restricting force is applied by performing a step of irradiating the photo-alignment film with polarized light in an oblique direction or a step of irradiating the photo-alignment film with non-polarized light in an oblique direction.

The thickness of the alignment film is not particularly limited as long as the alignment function can be exhibited, but is preferably in a range of 0.01 to 5 μm and more preferably in a range of 0.05 to 2 sm.

Examples of the photo-alignment material used for the photo-alignment film include azo compounds described in JP2006-285197A, JP2007-076839A, JP2007-138138A, JP2007-094071A, JP2007-121721A, JP2007-140465A, JP2007-156439A, JP2007-133184A, JP2009-109831A, JP3883848B, and JP4151746B, aromatic ester compounds described in JP2002-229039A, maleimide and/or alkenyl-substituted nadiimide compounds having photo-alignment units described in JP2002-265541A and JP2002-317013A, photo-crosslinking silane derivatives described in JP4205195B and JP4205198B, photo-crosslinked polyimides, polyamides, or esters described in JP2003-520878A, JP2004-529220A, and JP4162850B, and compounds capable of photodimerization, particularly cinnamate compounds, chalcone compounds, and coumarin compounds described in JP1997-118717A (JP-H9-118717A), JP1998-506420A (JP-H10-506420A), JP2003-505561A, WO2010/150748A, JP2013-177561A, JP2014-012823A. Among these, azo compounds, photo-crosslinking polyimides, polyamides, esters, cinnamate compounds, or chalcone compounds are particularly preferable.

[Rod-Like Liquid Crystal Compound]

Preferred examples of the rod-like liquid crystal compound include azomethines, azoxys, cyanobiphenyls, cyanophenyl esters, benzoic acid esters, cyclohexanecarboxylic acid phenyl esters, cyanophenyl cyclohexanes, cyano-substituted phenyl pyrimidines, alkoxy-substituted phenyl pyrimidines, phenyldioxane, tolanes, and alkenyl cyclohexyl benzonitriles. These rod-like liquid crystal compound is fixed by introducing a polymerizable group into the terminal structure of the rod-like liquid crystal compound (the same applies to the disk-like liquid crystal described below) and carrying out polymerization and the curing reaction. As a specific example thereof, an example of a polymerizable nematic rod-like liquid crystal compound cured by ultraviolet rays is described in JP2006-209073A. Further, as the rod-like liquid crystal compound, a polymer liquid crystal compound can also be used in addition to the low-molecular-weight liquid crystal compound as described above. The polymer liquid crystal compound is a polymer having a side chain corresponding to a low-molecular-weight liquid crystal compound. An optically anisotropic layer formed of a polymer liquid crystal compound is described in JP1993-053016A (JP-H5-053016A) and the like.

Further, it is also preferable to use a rod-like liquid crystal compound exhibiting reverse dispersion wavelength dispersibility as the rod-like liquid crystal compound. Examples thereof include the rod-like liquid crystal compound exhibiting reverse dispersion wavelength dispersibility described in the pamphlet of WO2017/043438A. The optically anisotropic layer formed of the rod-like liquid crystal compound exhibiting reverse dispersion wavelength dispersibility can suppress the tinting of transmitted light in the viewing angle control system.

Here, the wavelength dispersibility of reverse dispersion denotes that the values of the Re ($\lambda$) and the Rth ($\lambda$) increase as the wavelength $\lambda$ increases.

In a case where the optically anisotropic layer is formed of a liquid crystal cured layer containing a rod-like liquid crystal compound, the average tilt angle of the main axis in which the refractive index is maximized is preferably 50 or greater and 85° or less and more preferably 10° or greater and 80° or less with respect to the main surface.

Further, in a case where the tilt azimuth of the rod-like liquid crystal compound is 90° or 270° (in a case where the tilt azimuth is perpendicular to the absorption axis of the second polarizer as observed in the front direction), the average tilt angle is preferably 450 or greater.

Further, in a case where the tilt azimuth of the rod-like liquid crystal compound is 0° or 180° (in a case where the tilt azimuth is parallel to the absorption axis of the second polarizer as observed in the front direction), the average tilt angle is preferably 45° or less.

Further, the product $\Delta$nd of the refractive index anisotropy $\Delta$n of the rod-like liquid crystal compound and the thickness d of the liquid crystal cured layer is preferably 60 nm or greater, more preferably 150 nm or greater, and still more preferably 300 nm or greater. Further, the refractive index anisotropy $\Delta$n of the rod-like liquid crystal compound is represented by a difference between the refractive index in the main axis direction in which the refractive index is maximized (so-called abnormal light refractive index) and the refractive index in the main axis direction in which the refractive index is minimized (so-called normal light refractive index).

It is preferable that the optical characteristics of the optically anisotropic layer consisting of the liquid crystal cured layer containing the rod-like liquid crystal compound are in the above-described ranges from the viewpoint that the asymmetry of the transmission characteristics of the viewing angle control system can be increased.

Figure 9:
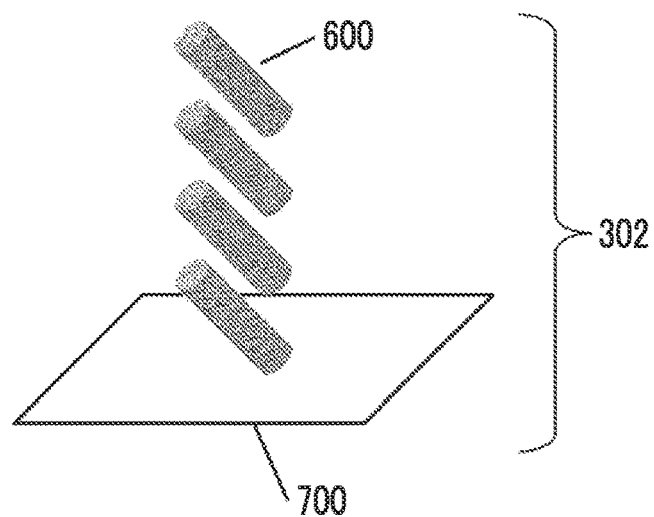
FIG. 9 is a schematic view illustrating an example of an optically anisotropic layer formed of a rod-like liquid crystal compound.

FIG. 9 is a schematic view illustrating an example of an optically anisotropic layer formed of a rod-like liquid crystal compound. An optically anisotropic layer 302 is formed by fixing a rod-like liquid crystal compound 600 on a base material 700 in a tilted state.

[Disk-Like Liquid Crystal Compound]

Examples of disk-like (discotic) liquid crystal compounds that can be used to prepare the optically anisotropic layer in the present invention include benzene derivatives described in the research report Mol. Cryst., written by Destrade et al., vol. 71, p. 111 (1981), truxene derivatives described in the research report Mol. Cryst., written by Destrade et al., vol. 122, p. 141 (1985) and Physics Lett, A, vol. 78, p. 82 (1990), cyclohexane derivatives described in the research report Angew. Chem., written by B. Kohne et al., vol. 96, p. 70 (1984), and aza-crown-based and phenylacetylene-based macrocycles described in the research report J. Chem. Commun., written by J. M. Lehn et al., p. 1794 (1985) and the research report J. Am. Chem. Soc., written by J. Zhang et al., vol. 116, p. 2655 (1994).

Examples of the molecules of the disk-like liquid crystal compound include a compound exhibiting liquid crystallinity with a structure in which a linear alkyl group, an alkoxy group, and a substituted benzoyloxy group are radially substituted as a side chain of the mother nucleus with respect to the mother nucleus at the center of the molecule. It is preferable that the molecule or the aggregate of molecules is a compound having rotational symmetry and capable of imparting certain alignment. The optically anisotropic layer formed of the composition containing a disk-like liquid crystal compound is not required to exhibit liquid crystallinity in a state of being finally contained in the optically anisotropic layer. For example, in a case where a low-molecular-weight disk-like liquid crystal molecule containing a group that reacts with heat or light is subjected to a polymerization reaction or the like by being heated or irradiated with light to increase the molecular weight, the liquid crystallinity is lost, but the optically anisotropic layer containing such a high-molecular-weight compound can also be used in the present invention. Preferred examples of the disk-like liquid crystal compound include compounds described in JP1996-050206A (JP-H8-050206A). Further, the polymerization of the disk-like liquid crystal molecule is described in JP1996-027284A (JP-H8-027284A).

In order to fix the disk-like liquid crystal molecule by polymerization, it is necessary to bond a polymerizable group as a substituent to the disk-like core of the disk-like liquid crystal molecule. As the polymerizable group bonded to a disk-like core, a compound that is bonded via a linking group is preferable. In this manner, the alignment state can be maintained even in the polymerization reaction. Example of such a compound include compounds described in paragraphs [0151] to [0168] in JP2000-155216A.

The discotic nematic liquid crystal phase-solid phase transition temperature of the disk-like liquid crystal molecule is preferably in a range of 70° C. to 300° C. and more preferably in a range of 70° C. to 170° C.

In a case where the optically anisotropic layer is formed of a liquid crystal cured layer containing a disk-like liquid crystal compound, the average tilt angle of the main axis in which the refractive index is minimized is preferably 5° or greater and 850 or less and more preferably 10° or greater and 80° or less with respect to the main surface.

Further, in a case where the tilt azimuth of the disk-like liquid crystal compound is 90° or 270° (the tilt azimuth is perpendicular to the absorption axis of the second polarizer as observed in the front direction), the average tilt angle is preferably 45° or greater.

Further, in a case where the tilt azimuth of the disk-like liquid crystal compound is 0° or 180° (the tilt azimuth is parallel to the absorption axis of the second polarizer as observed in the front direction), the average tilt angle is preferably 45° or less.

Further, the product $\Delta nd$ of the refractive index anisotropy $\Delta n$ of the disk-like liquid crystal compound and the thickness d of the liquid crystal cured layer is preferably 60 nm or greater, more preferably 150 nm or greater, and still more preferably 300 nm or greater. Further, the refractive index anisotropy $\Delta n$ of the disk-like liquid crystal compound is represented by a difference between the refractive index in the main axis direction in which the refractive index is maximized (so-called normal light refractive index) and the refractive index in the main axis direction in which the refractive index is minimized (so-called abnormal light refractive index).

It is preferable that the optical characteristics of the optically anisotropic layer consisting of the liquid crystal cured layer containing the disk-like liquid crystal compound are in the above-described ranges from the viewpoint that the asymmetry of the transmission characteristics of the viewing angle control system can be increased.

Figure 10:
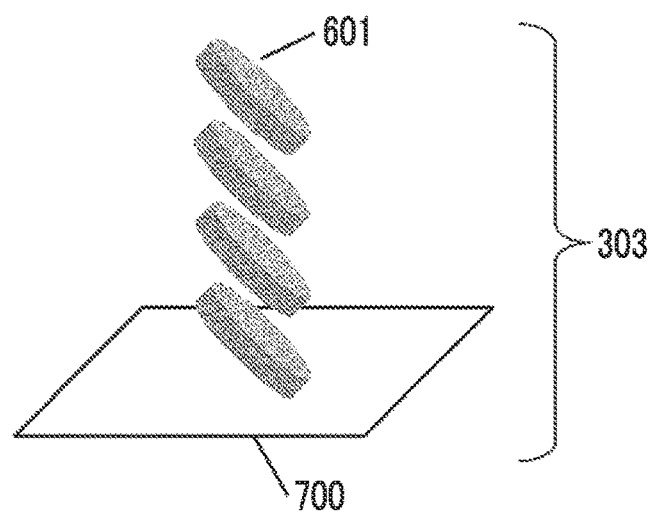
FIG. 10 is a schematic view illustrating an example of an optically anisotropic layer formed of a disk-like liquid crystal compound.

FIG. 10 is a schematic view illustrating an example of an optically anisotropic layer formed of a disk-like liquid crystal compound. An optically anisotropic layer 303 is formed by fixing a disk-like liquid crystal compound 601 on the base material 700 in a tilted state.

[Additive]

In the composition for forming the optically anisotropic layer (polymerizable liquid crystal composition) in the present invention, additives such as a plasticizer, a surfactant, and a polymerizable monomer may be used in combination with the liquid crystal compound. These additives are added for various purposes such as improving the uniformity of the coating film, the hardness of the film, the aligning properties of the liquid crystal molecules, and the like.

Examples of the polymerizable monomer include radically polymerizable compounds and cationically polymerizable compounds. A polyfunctional radically polymerizable monomer is preferable, and a monomer that is copolymerizable with the liquid crystal compound containing a polymerizable group described above is preferable. Example thereof include monomers described in paragraphs [0018] to [0020] in JP2002-296423A. The amount of the compound to be added is typically in a range of 1% to 50% by mass and preferably in a range of 5% to 30% by mass with respect to the liquid crystal compound.

Examples of the surfactant include known compounds of the related art, and a fluorine-based compound is particularly preferable. Specific examples thereof include compounds described in paragraphs [0028] to [0056] in JP2001-330725A.

Examples of a polymer that can be used as an additive include cellulose ester. Preferred examples of the cellulose ester include those described in paragraph [0178] in JP2000-155216A. The amount of the polymer to be added is preferably in a range of 0.1% to 10% by mass and more preferably in a range of 0.1% to 8% by mass from the viewpoint that the alignment of the liquid crystal molecules is not inhibited.

[Method of Forming Optically Anisotropic Layer Formed of Liquid Crystal Compound]

The optically anisotropic layer in the present invention can be formed by coating the surface, preferably the surface of the alignment film, with a coating solution containing a liquid crystal molecule and, as necessary, a polymerization initiator described below and an optional component.

As the solvent used for preparing the coating solution, an organic solvent is preferably used. Examples of the organic solvent include an amide (such as N,N-dimethylformamide), a sulfoxide (such as dimethyl sulfoxide), a heterocyclic compound (such as pyridine), a hydrocarbon (such as benzene or hexane), an alkyl halide (such as chloroform, dichloromethane, or tetrachloroethane), an ester (such as methyl acetate or butyl acetate), a ketone (such as acetone or methyl ethyl ketone), and an ether (such as tetrahydrofuran or 1,2-dimethoxyethane). Among these, an alkyl halide and a ketone are preferable. A combination of two or more kinds of organic solvents may be used.

The coating solution can be applied by a known method of the related art. The optically anisotropic layer may be formed as a single film by one coating, or may be formed as a laminate of a plurality of layers by laminated coating or bonding.

As a method of maintaining the alignment state of the aligned liquid crystal molecule and fixing the alignment, a method of carrying out a polymerization reaction is preferable. Examples of the polymerization reaction include a thermal polymerization reaction using a thermal polymerization initiator and a photopolymerization reaction using a photopolymerization initiator. Among these, the photopolymerization reaction is more preferable. Examples of photopolymerization initiators include α-carbonyl compounds (described in U.S. Pat. Nos. 2,367,661A and 2,367,670A), acyloin ether (described in U.S. Pat. No. 2,448,828A), α-hydrogen-substituted aromatic acyloin compounds (described in U.S. Pat. No. 2,722,512A), polynuclear quinone compounds (described in U.S. Pat. Nos. 3,046,127A and 2,951,758A), combinations of triarylimidazole dimers and p-aminophenyl ketone (described in U.S. Pat. No. 3,549,367A), acridine and phenazine compounds (described in JP1985-105667A (JP-S60-105667A) and U.S. Pat. No. 4,239,850A), and oxadiazole compounds (described in U.S. Pat. No. 4,212,970A).

The amount of the photopolymerization initiator to be used is preferably in a range of 0.01% to 20% by mass and more preferably in a range of 0.5% to 5% by mass with respect to the solid content of the coating solution.

It is preferable to use ultraviolet rays for light irradiation for the polymerization of liquid crystal molecules.

The irradiation energy is preferably in a range of 20 mJ/cm$^2$ to 50 J/cm$^2$, more preferably in a range of 20 to 5000 mi/cm$^2$, and still more preferably in a range of 100 to 800 mJ/cm$^2$. Further, light irradiation may be carried out under heating conditions in order to promote the photopolymerization reaction.

The average direction of the major axis of the liquid crystal molecules in the optically anisotropic layer can be adjusted by selecting the liquid crystal compound or the material of the alignment film to be used for forming the optically anisotropic layer, selecting the conditions of the rubbing treatment method, or selecting the polarization direction of the polarized light applied to the photo-alignment film or the irradiation angle of the non-polarized light. Further, the major axis (disc plane) direction of the liquid crystal molecules on the surface side (air side) in the optically anisotropic layer can be adjusted by selecting the kind of the additive (such as a plasticizer, a surfactant, a polymerizable monomer, or a polymer) to be used together with the liquid crystal molecules used for forming the optically anisotropic layer. The degree of change of the major axis alignment direction can also be adjusted by selecting the liquid crystal molecule and the additive as described above.

(Viewing Angle Control Polarizing Plate)

The viewing angle control polarizing plate of the present invention is formed by laminating at least the first polarizer and the optically anisotropic layer.

The viewing angle control polarizing plate of the present invention can be used by being combined with the second polarizer to prepare the viewing angle control system according to the embodiment of the present invention. In typical liquid crystal display devices and organic EL display devices, a polarizing plate having an absorption axis in the in-plane direction of the display surface is laminated in many cases. Therefore, the viewing angle control polarizing plate of the present invention is highly convenient from the viewpoint that the viewing angle control polarizing plate can be subsequently bonded to the polarizing plate that has been already attached to a liquid crystal display device or an organic EL display device to prepare the viewing angle control system according to the embodiment of the present invention.

(Second Polarizer)

The second polarizer in the present invention is formed such that the direction of the absorption axis is horizontal to the film surface.

As the second polarizer, a polarizer in which a dichroic substance is horizontally aligned can be used. For example, a polarizer in which a dichroic substance is horizontally aligned by dyeing and stretching the dichroic substance on polyvinyl alcohol or another polymer resin or a polarizer in which a dichroic substance is horizontally aligned by applying alignment of a liquid crystal compound as in a case of the light absorption anisotropic layer of the present invention may be employed.

A polarizer obtained by stretching polyvinyl alcohol and dyeing the polyvinyl alcohol with iodine is commonly used as a polarizer layer of a polarizing plate provided in a liquid crystal display device or an organic EL display device. Therefore, in a case where the viewing angle control system according to the embodiment of the present invention is used for a liquid crystal display device or an organic EL display device, the polarizing plate provided in the liquid crystal display device or the organic EL display device may also serve as the second polarizer of the present invention.

Further, the second polarizer may be a reflective polarizer or a laminate of an absorption type polarizer (typical polarizer) and a reflective polarizer. A reflective polarizer is a polarizer that reflects one polarized light and transmits the other polarized light. Further, the reflective polarizer has a reflection axis and a transmission axis in the plane, but the reflection axis functions in the same manner as the absorption axis in a typical polarizer in terms that the reflection axis does not transmit polarized light in the azimuth, and thus the reflection axis can be read as the absorption axis in the present specification.

In a case where the second polarizer is a reflective polarizer, since light that is not transmitted through the reflective polarizer is reflected, the reflected light is reused and thus light utilization efficiency can be increased, for example, in a case where the viewing angle control system is incorporated in a backlight of a liquid crystal display device.

As the reflective polarizer, a brightness-improving film "DBEF" or "APF" (manufactured by 3M Company), a wire grid polarizing film "WGF" (manufactured by Asahi Kasei Corporation), or the like can be suitably used.

(Viewing Angle Control System)

The viewing angle control system according to the embodiment of the present invention includes at least the first polarizer, the optically anisotropic layer, and the second polarizer in this order, but may include other functional layers. Examples of other functional layers may include a pressure sensitive adhesive layer, an adhesive layer, an antireflection layer, and a protective layer.

A method of producing the viewing angle control system may include a step of respectively preparing the first polarizer, the optically anisotropic layer, the second polarizer, and other functional layers and bonding these with a pressure sensitive adhesive or an adhesive.

Further, for example, the method may also include a step of transferring the optically anisotropic layer formed on the base material to the second polarizer (bonding the optically anisotropic layer to the second polarizer and peeling the base material off) and a step of transferring the first polarizer formed on the base material to the optically anisotropic layer.

Further, the method may also include a step of preparing the optically anisotropic layer by directly coating the first polarizer with the optically anisotropic layer and a step of directly forming the first polarizer on the optically anisotropic layer after the formation of the optically anisotropic layer.

Each step can be carried out by a known method and the present invention is not particularly limited thereto.

(Image Display Device)

The viewing angle control system according to the embodiment of the present invention can be used for an optional image display device.

The image display device is not particularly limited, and examples thereof include a liquid crystal display device, an organic EL display device, a micro LED display device, a head-up display, and a head-mounted display.

A liquid crystal display device typically includes a liquid crystal cell and a backlight, and a polarizing plate is provided on both the viewing side and the backlight side of the liquid crystal cell. The viewing angle control system according to the embodiment of the present invention can be applied to any one or both surfaces on the viewing side or the backlight side of the liquid crystal display device. The application of the viewing angle control system to a liquid crystal display device can be realized by replacing the polarizing plate on any one or both surfaces of the liquid crystal display device with the viewing angle control system according to the embodiment of the present invention. Alternatively, the viewing angle control system can be applied to a liquid crystal display device by bonding the polarizing plate for the viewing angle control system according to the embodiment of the present invention to the polarizing plate on any one or both surfaces of the liquid crystal display device.

In a case where the viewing angle control system according to the embodiment of the present invention is applied to a liquid crystal display device, it is preferable that the second polarizer is disposed on a side closer to the liquid crystal cell with respect to the first polarizer from the viewpoint of enhancing the display performance of the liquid crystal display device. Further, in a case where the viewing angle control system according to the embodiment of the present invention is applied to the backlight side of the liquid crystal display device, it is preferable that the second polarizer is a reflective polarizer or a laminate of a typical polarizer and a reflective polarizer from the viewpoint of increasing the light utilization efficiency.

Some image display devices are thin and can be molded into a curved surface. The viewing angle control system according to the embodiment of the present invention is thin and easily bent and thus can be suitably applied to an image display device having a curved display surface.

Further, some image display devices have a pixel density of greater than 250 ppi and are capable of high-definition display. The viewing angle control system according to the embodiment of the present invention can be suitably applied to such a high-definition image display device without causing moire.

EXAMPLES

Hereinafter, the present invention will be described in more detail based on the following examples. The materials, the reagents, the amounts of materials and the proportions of the materials, the operations, and the like shown in the following examples can be appropriately changed within a range not departing from the scope of the present invention. Therefore, the scope of the present invention is not limited to the following specific examples.

[Preparation of First Polarizer]

The first polarizer 10 used in the examples and the comparative examples of the present invention was prepared as follows.

<Preparation of Transparent Support 1 with Alignment Film>

A surface of a cellulose acylate film (TAC base material having a thickness of 40 μm; TG40, manufactured by FUJIFILM Corporation) was saponified with an alkaline solution and coated with the following coating solution 1 for forming an alignment layer using a wire bar. The cellulose acylate film on which the coating film had been formed was dried with hot air at 60° C. for 60 seconds and further dried with hot air at 100° C. for 120 seconds to form an alignment layer PA1, thereby obtaining a transparent support 1 with an alignment layer.

The film thickness of the alignment film PA1 was 0.5 μm.

| (Coating solution 1 for forming alignment layer) | |
|---|---|
| Modified polyvinyl alcohol shown below: | 3.80 parts by mass |
| Initiator Irg2959: | 0.20 parts by mass |
| Water: | 70 parts by mass |
| Methanol: | 30 parts by mass |

Modified polyvinyl alcohol

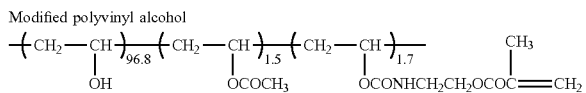

<Formation of Light Absorption Anisotropic Layer P1>

The obtained alignment layer PA1 was continuously coated with the following composition 1 for forming a light absorption anisotropic layer with a wire bar to form a coating layer.

Next, the coating layer was heated at 140° C. for 30 seconds and cooled to room temperature (23° C.).

Next, the coating layer was heated at 80° C. for 60 seconds and cooled to room temperature again.

Thereafter, the coating layer was irradiated with an LED lamp (center wavelength of 365 nm) for 2 seconds under an irradiation condition of an illuminance of 200 mW/cm², thereby preparing a light absorption anisotropic layer P1 on the alignment layer PA1.

The film thickness of the light absorption anisotropic layer P1 was 3 μm, and the degree of alignment thereof was 0.96. The light absorption anisotropic layer P1 with a support obtained above was used as a first polarizer 10.

| (Composition 1 for forming light absorption anisotropic layer) | |
|---|---|
| Dichroic substance D-1 shown below: | 0.40 parts by mass |
| Dichroic substance D-2 shown below: | 0.15 parts by mass |
| Dichroic substance D-3 shown below: | 0.63 parts by mass |
| Polymer liquid crystal compound P-1 shown below: | 3.20 parts by mass |
| Low-molecular-weight liquid crystal compound M-1 shown above: | 0.45 parts by mass |
| Polymerization initiator IRGACURE OXE-02 (manufactured by BASF SE): | 0.040 parts by mass |
| Compound E-1 shown below: | 0.060 parts by mass |

| (Composition 1 for forming light absorption anisotropic layer) | |
|---|---:|
| Compound E-2 shown below: | 0.060 parts by mass |
| Surfactant F-1 shown below: | 0.010 parts by mass |
| Surfactant F-2 shown below: | 0.015 parts by mass |
| Cyclopentanone: | 47.00 parts by mass |
| Tetrahydrofuran: | 47.00 parts by mass |
| Benzyl alcohol: | 1.00 parts by mass |

Dichroic substance D-1

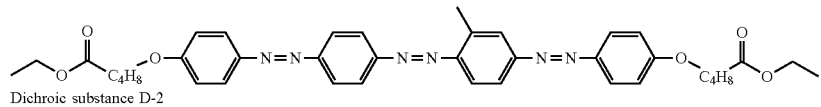

Dichroic substance D-2

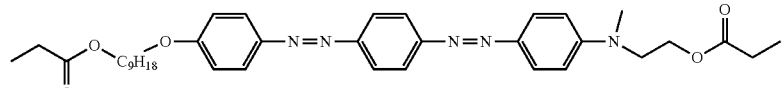

Dichroic substance D-3

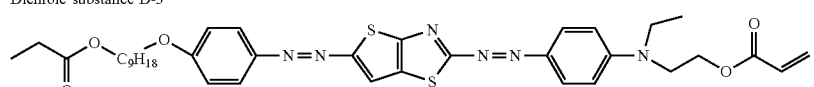

Polymer liquid crystal compound P-1

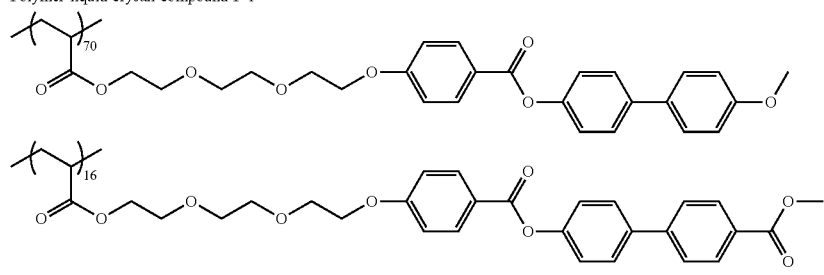

Low-molecular-weight liquid crystal compound M-1

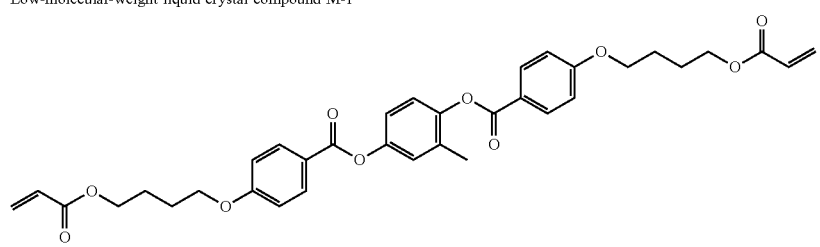

Compound E-1

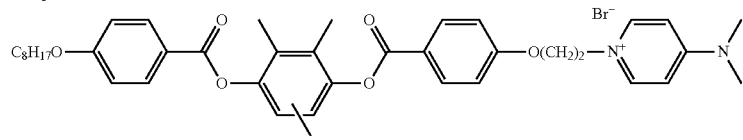

Compound E-2

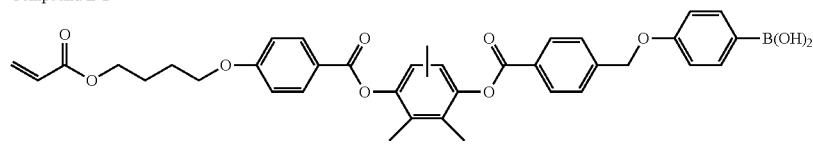

Surfactant F-1

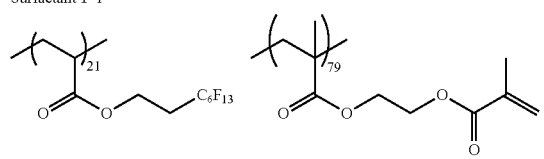

(Composition 1 for forming light absorption anisotropic layer)

Surfactant F-2

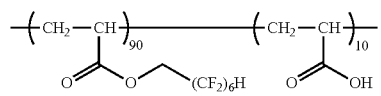

[Preparation of Optically Anisotropic Layer]

Various optically anisotropic layers used in the examples of the present invention were prepared as follows.

<Preparation of Optically Anisotropic Layer of Example 1>

(Preparation of Transparent Support with Alignment Film)

The following alignment film coating solution was prepared, heated and dissolved at 85° C. for 1 hour while being stirred, and filtered through a filter having a pore diameter of 0.45 μm.

| (Alignment film coating solution) |
| --- |
| Polyvinyl alcohol (PVA203, manufactured by Kuraray Co., Ltd.): 2.4 parts by mass |
| Pure water: 97.6 parts by mass |

Next, a triacetyl cellulose film (TAC film) (manufactured by FUJIFILM Corporation) having a thickness of 40 μm was prepared, and the TAC film was coated with the prepared alignment film coating solution while adjusting the coating amount such that the film thickness after drying was set to 0.5 μm, and the film was dried at 100° C. for 2 minutes.

The dried coating film was subjected to a mubbing treatment, thereby preparing a transparent support with an alignment film. The direction of the rubbing treatment was parallel to the longitudinal direction of the film.

Further, it was confirmed a typical polyethylene terephthalate film (PET film, for example, COSMOSHINE A4100, manufactured by Toyobo Co., Ltd.) can be used in addition to the TAC film as the support for an alignment film.

(Preparation of Tilt Alignment Liquid Crystal Layer X1)

The following polymerizable liquid crystal composition X1 was stirred and dissolved at room temperature to obtain a uniform solution. After the dissolution, the solution was filtered through a filter having a pore diameter of 0.45 μm.

| (Polymerizable liquid crystal composition XI) | |
| --- | --- |
| Discotic liquid crystal compound B-1: | 100 parts by mass |
| Polymerizable monomer S1: | 10 parts by mass |
| Polymerization initiator (IRGACURE 907, manufactured by BASF SE): | 3 parts by mass |
| Methyl ethyl ketone: | 339 parts by mass |

Discotic liquid crystal compound B-1
(polymerizable triphenylene type discotic liquid crystal compound)

(Polymerizable liquid crystal composition XI)

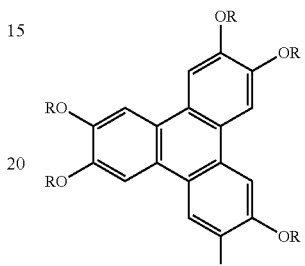

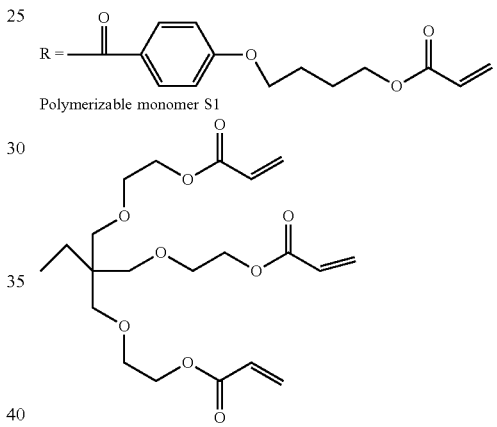

Polymerizable monomer S1

The rubbing surface of the alignment film prepared by the above-described method was coated with the prepared polymerizable liquid crystal composition X1 while the coating amount thereof was adjusted such that the film thickness after drying and exposure to ultraviolet rays was set to 0.6 μm, dried, and exposed to ultraviolet rays, the entire surface was photocured, and the alignment was fixed, thereby preparing a tilt alignment liquid crystal layer X1. Here, the drying was carried out under conditions of 105° C. for 2 minutes, and the ultraviolet exposure was carried out under conditions of 80 mW/cm$^2$, 500 mJ/cm$^2$, and 80° C. under nitrogen purge (oxygen concentration of 500 ppm or less).

(Preparation of Tilt Alignment Liquid Crystal Transfer Film Y1)

The following polymerizable liquid crystal composition Y1 was prepared and stirred and dissolved at room temperature to obtain a uniform solution. After the dissolution, the solution was filtered through a filter having a pore diameter of 0.45 μm.

| (Polymerizable liquid crystal composition Y1) | |
| --- | --- |
| Discotic liquid crystal compound A-1: | 80 parts by mass |
| Discotic liquid crystal compound A-2: | 20 parts by mass |

-continued

| (Polymerizable liquid crystal composition Y1) | |
| --- | --- |
| Discotic liquid crystal compound B-1: | 10 parts by mass |
| Polymerizable monomer S1: | 10 parts by mass |
| Polymer C-1: | 0.3 parts by mass |
| Polymerization initiator (IRGACURE 907, manufactured by BASF SE): | 5 parts by mass |
| Methyl ethyl ketone: | 356 parts by mass |

Discotic liquid crystal compound A-1
(1,3,5-substituted benzene type polymerizable discotic liquid crystal compound)

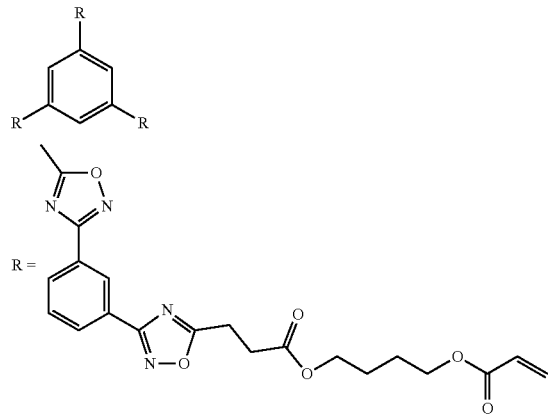

Discotic liquid crystal compound A-2
(1,3,5-substituted benzene type polymerizable discotic liquid crystal compound)

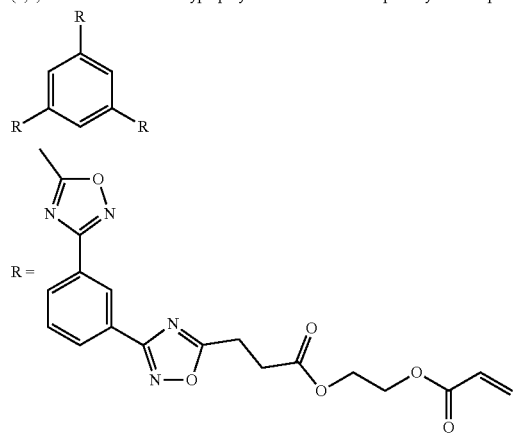

Polymer C-1

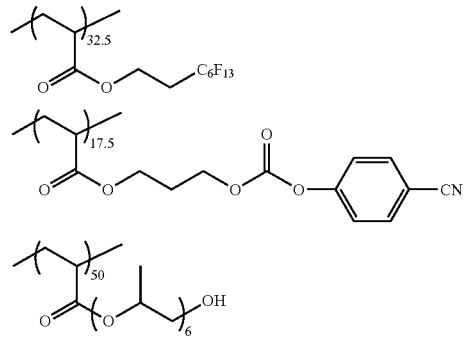

The numbers described in each of the above-described constitutional units represent % by mass of each constitutional unit with respect to all the constitutional units of the polymer C-1, and the values are 32.5% by mass, 17.5% by mass, and 50.0% by mass from the left side.

The tilt alignment liquid crystal layer X1 was coated with the polymerizable liquid crystal composition Y1 while the coating amount thereof was adjusted such that the film thickness after drying and exposure to ultraviolet rays was set to 2.0 µm, dried, and exposed to ultraviolet rays, the entire surface was photocured, and the alignment was fixed, thereby obtaining a tilt alignment liquid crystal transfer film Y1 having a tilt alignment liquid crystal layer Y1. Here, the drying was carried out under conditions of 120° C. for 2 minutes, and the ultraviolet exposure was carried out under conditions of 80 mW/cm$^2$, 500 mJ/cm$^2$, and 80° C. The ultraviolet exposure was performed without nitrogen purge.

(Measurement of Tilt Angle)

The prepared tilt alignment liquid crystal transfer film Y1 was cut in the tilt azimuth of the liquid crystal cured layer using a microtome (manufactured by Leica, rotating microtome: RM2265) to prepare sections such that the cross section in the film thickness direction was exposed. Next, the polarizer and the analyzer of the polarizing microscope were cross-nicol arranged, and the prepared sections were placed therebetween, and the azimuthal angles extinguished at the interface between the alignment film and the tilt alignment liquid crystal layer X1, the interface between the tilt alignment liquid crystal layer X1 and the tilt alignment liquid crystal layer Y1, and the interface between the tilt alignment liquid crystal layer Y1 and the air were measured. Thereafter, a sensitive color plate (λ plate) was inserted, the color at the interface was observed, the direction of the slow axis in the section was investigated, and the tilt angle of the liquid crystal cured layer was determined.

The tilt angles of the prepared tilt alignment liquid crystal transfer film Y1 were 83° at the interface between the alignment film and the tilt alignment liquid crystal layer X1, 65° at the interface between the tilt alignment liquid crystal layer X1 and the tilt alignment liquid crystal layer Y1, and 55° at the interface between the tilt alignment liquid crystal layer Y1 and the air. The average tilt angle of the tilt alignment liquid crystal layer Y1 was 60°.

Unless otherwise specified, the tilt angle of the discotic liquid crystal is defined as the angle formed between the support surface and the main axis in which the refractive index is minimized. That is, for example, the expression "tilt angle of the tilt alignment liquid crystal layer consisting of the discotic liquid crystal is 60°'" denotes that the angle between the support surface and the disc plane of the discotic liquid crystal is 30°.

(Measurement of Δnd)

The prepared tilt alignment liquid crystal transfer film Y1 was bonded to glass using a commercially available pressure sensitive adhesive SK2057 (manufactured by Soken Chemical Co., Ltd.), and the TAC film with an alignment film was peeled off. By carefully carrying out the peeling, the TAC film was able to be peeled at the interface between the tilt alignment liquid crystal layer X1 and the tilt alignment liquid crystal layer Y1 and transferred so that only the tilt alignment liquid crystal layer Y1 remained on the glass side.

In a case where the tilt alignment liquid crystal layer Y1 obtained above was measured using AxoScan (manufactured by Axometrics), Δnd was 150 nm at a wavelength of 550 nm.

The tilt alignment liquid crystal layer Y1 prepared in the above-described manner was used as an optically anisotropic layer 303 of Example 1.

<Preparation of Optically Anisotropic Layer of Example 2>

A tilt alignment liquid crystal layer X2 was prepared in the same manner as that for the tilt alignment liquid crystal layer X1 except that the film thickness was changed to 1.1 µm in the procedures for preparing the tilt alignment liquid crystal layer X1. Next, a tilt alignment liquid crystal layer Y2 was prepared on the tilt alignment liquid crystal layer X2 in the same manner as that for the tilt alignment liquid crystal layer Y1 except that the amount of the polymer C-1 added was changed to 0.5 parts by mass and the film thickness was changed to 4.0 μm in the polymerizable liquid crystal composition Y1.

The obtained tilt alignment liquid crystal layer Y2 had an average tilt angle of 30° and a Δnd of 150 nm.

The tilt alignment liquid crystal layer Y2 prepared in the above-described manner was used as an optically anisotropic layer 304 of Example 2.

<Preparation of Optically Anisotropic Layer of Example 5>

A tilt alignment liquid crystal layer X3 was prepared in the same manner as that for the tilt alignment liquid crystal layer X1 except that the film thickness was changed to 0.4 μm in the procedures for preparing the tilt alignment liquid crystal layer X1. Next, a tilt alignment liquid crystal layer Y3 was prepared on the tilt alignment liquid crystal layer X3 in the same manner as that for the tilt alignment liquid crystal layer Y1 except that the amount of the polymer C-1 added was changed to 0.2 parts by mass and the film thickness was changed to 4.0 μm in the polymerizable liquid crystal composition Y1.

The obtained tilt alignment liquid crystal layer Y3 had an average tilt angle of 80° and a Δnd of 300 nm.

The tilt alignment liquid crystal layer Y3 prepared in the above-described manner was used as an optically anisotropic layer 305 of Example 5.

[Preparation of Viewing Angle Control Polarizing Plate]

The first polarizer 10 prepared above and various optically anisotropic layers were appropriately banded to each other using a commercially available pressure sensitive adhesive SK2057 (manufactured by Soken Chemical Co., Ltd.) to prepare a viewing angle control polarizing plate. The thickness of SK2057 was approximately 20 μm.

The configurations of the prepared viewing angle control polarizing plates in the examples are listed in Table 1.

Further, in the production of the viewing angle control polarizing plate of Example 2, one sheet of the above-described optically anisotropic layer 304 was firstly transferred to the first polarizer 10, and one more sheet of the optically anisotropic layer 304 was transferred thereto for preparation of the viewing angle control polarizing plate. Further, even in the preparation of the viewing angle control polarizing plate of Examples 3 and 4, similarly, two sheets of the above-described optically anisotropic layers 303 or optically anisotropic layers 304 were sequentially transferred to the first polarizer 10 for preparation of the viewing angle control polarizing plate.

[Preparation of Viewing Angle Control Systems of Examples 1 to 5]

The various viewing angle control polarizing plates prepared above were bonded onto a viewing-side polarizing plate of the liquid crystal display device of dynabook (manufactured by Toshiba Corporation), which is a notebook computer equipped with a liquid crystal display device, using a pressure sensitive adhesive SK2057. Further, in the viewing-side polarizing plate of dynabook, the azimuth of the absorption axis was in the longitudinal direction. In this manner, a viewing angle control system having the viewing-side polarizing plate of dynabook as the second polarizer was prepared.

The summary of the prepared viewing angle control systems of Examples 1 to 5 is listed in Table 1.

In a case where the viewing angle control polarizing plate was bonded, the orientation of the viewing angle control polarizing plate was adjusted such that the tilt azimuth of the liquid crystal cured layer of the optically anisotropic layer was as listed in Table 1. Here, the orientation of the tilt azimuth was represented by an azimuthal angle in which the azimuth of the absorption axis of the viewing-side polarizing plate of dynabook was set to 0°.

[Preparation of Viewing Angle Control System of Comparative Example 1]

A viewing angle control system of Comparative Example 1 was prepared in the same manner as in Examples 1 to 4 except that a louver film "PF14 H2" (manufactured by 3M Company) was used in place of the viewing angle control polarizing plate described above.

The louver film was disposed such that the direction of the louver was in the longitudinal direction (in a direction in which the azimuthal angle was 0°).

[Preparation of Viewing Angle Control System of Comparative Example 2]

A viewing angle control system of Comparative Example 2 which did not have an optically anisotropic layer was prepared in the same manner as in Examples 1 to 4 except that only the first polarizer 10 was used in place of the viewing angle control polarizing plate described above.

The summary of the prepared viewing angle control system of Comparative Example 2 is listed in Table 1.

[Preparation of Viewing Angle Control System of Comparative Example 3]

A viewing angle control system of Comparative Example 3 was prepared in the same manner as in Examples 1 to 4 except that a cellulose acylate film TG40 (TAC base material having a thickness of 40 μm; manufactured by FUJIFILM Corporation) was used in place of the optically anisotropic layer described above.

The Re of the cellulose acylate film TG40 had was 1.6 nm and the Rth thereof was 26 nm, and the main axis of the refractive index was not tilted in the in-plane direction.

The summary of the prepared viewing angle control system of Comparative Example 3 is listed in Table 1.

(Evaluation of Brightness of Viewing Angle Control System in Oblique Direction)

The transmission characteristics of the prepared viewing angle control systems of the examples and the comparative examples were measured using a viewing angle characteristic evaluation device EZContrast (manufactured by ELDIM). Further, the liquid crystal display device of dynabook displayed the entire screen in white during the measurement.

Values of the brightness of front surface (polar angle of 0°), azimuthal angle of 45°/polar angle of 60°, azimuthal angle of 135°/polar angle of 60°, azimuthal angle of 225°/polar angle of 60°, and azimuthal angle of 315°/polar angle of 60° were extracted from the obtained brightness data, and the ratios of the brightness in the oblique direction to the front brightness were respectively calculated.

The results are listed in Table 1.

In a case where the ratio of the brightness in the oblique direction to the front brightness was 5% or less, the light shielding performance in the direction was satisfactory, and the displayed contents were difficult to read in a case of observation in the direction.

As listed in Table 1, the viewing angle control system of the present invention had asymmetric transmission characteristics in the longitudinal direction and the lateral direction. Specifically, since the viewing angle control systems of Examples 1 to 3 had a tilt azimuth of 270°, the viewing angle control systems had asymmetric transmission characteristics with respect to the axes of the azimuthal angles of 0° and 180° (that is, in the lateral direction). Particular, in the viewing angle control system of Example 3, since Δnd was 300 nm or greater and the tilt angle of 450 or greater, the asymmetry was significant, and the light shielding performance was satisfactory in the directions of azimuthal angles of 45° and 135°.

Further, since the viewing angle control system of Example 4 had a tilt azimuth of 0°, the viewing angle control system had asymmetric transmission characteristics with respect to the axes of the azimuthal angles of 90° and 270° (that is, in the longitudinal direction). Further, since Δnd was 300 nm or greater and the tilt angle was 45° or less, the asymmetry was significant and the light shielding performance was satisfactory in the directions of the azimuthal angles of 45° and 315°.

The viewing angle control systems of Comparative Examples 1 to 3 did not exhibit asymmetry as the transmission characteristics in the longitudinal direction and the lateral direction.

(Evaluation of Moire of Viewing Angle Control System)

Each of the prepared viewing angle control polarizing plates was bonded onto a liquid crystal display device of a smartphone iPhone 8 Plus (registered trademark, manufactured by Apple Inc., the same applies hereinafter), and moire was evaluated.

Further, the iPhone 8 Plus (registered trademark) was a smartphone equipped with a high-definition liquid crystal display device, and the pixel density of the liquid crystal display device was 401 ppi. A black and white stripe pattern in which black and white were alternatingly disposed for each pixel in the machine direction was displayed on the liquid crystal display device, the black and white stripe pattern was observed from the front, and the moire was visually evaluated.

The results are listed in Table 1.

As listed in Table 1, moire was visually recognized in the louver film, but moire was not visually recognized from any of the viewing angle control polarizing plates of the present invention. Therefore, the viewing angle control polarizing plates of the present invention had excellent display performance on the front surfaces.

TABLE 1

| | Configuration of viewing angle control polarizing plate | | | | | Evaluation result | | | | |
|---|---|---|---|---|---|---|---|---|---|---|
| | | Optically anisotropic layer | | | | Brightness in oblique direction (ratio of brightness in oblique direction to brightness in front direction) | | | | |
| | First polarizer | Type | Δnd | Tilt azimuth | Average tilt angle | Thickness | Azimuth angle of 45°/polar angle of 60° | Azimuth angle of 135°/polar angle of 60° | Azimuth angle of 225°/polar angle of 60° | Azimuth angle of 315°/polar angle of 60° | Moire Visibility |
| Example 1 | First polarizer 10 | Optically anisotropic layer 303 | 150 nm | 270° | 60° | 67 μm | 4.8% | 4.9% | 8.7% | 8.9% | Not visually recognized |
| Example 2 | First polarizer 10 | Optically anisotropic layer 304 | 300 nm | 270° | 30° | 87 μm | 4.6% | 4.9% | 17.2% | 16.8% | Not visually recognized |
| Example 3 | First polarizer 10 | Optically anisotropic layer 303 | 300 nm | 270° | 60° | 86 μm | 1.3% | 1.2% | 8.9% | 9.1% | Not visually recognized |
| Example 4 | First polarizer 10 | Optically anisotropic layer 304 | 300 nm | 0° | 30° | 86 μm | 3.5% | 16.0% | 16.5% | 3.4% | Not visually recognized |
| Example 5 | First polarizer 10 | Optically anisetropic layer 305 | 300 nm | 270° | 80° | 87 μm | 4.5% | 4.5% | 11.0% | 11.0% | Not visually recognized |
| Comparative Example 1 | Not available (louver film) | Not available | — | — | — | 500 μm | 0.7% | 0.7% | 0.7% | 0.7% | Not visually recognized |
| Comparative Example 2 | First polarizer 10 | Not available | — | — | — | 44 μm | 9.0% | 9.0% | 9.0% | 9.0% | Not visually recognized |
| Comparative Example 3 | First polarizer 10 | TG40 | 1.6 nm | — | — | 104 μm | 9.0% | 9.0% | 9.0% | 9.0% | Not visually recognized |

As listed in Table 1, the viewing angle control system of the present invention had asymmetric transmission characteristics in the longitudinal or lateral direction, did not cause moire even in a case of being used in combination with a high-definition image display device, and had excellent display performance on the front surface. Further, all of the viewing angle control polarizing plate of the present invention had a thickness of 100 μm or less and were easy to bend. Further, the louver film used in Comparative Example 1 had a thickness of 500 μm and was difficult to bend.

Further, in a case where a bending test was performed on the viewing angle control polarizing plates of the examples and the comparative examples using a mandrel having a diameter of 10 mm, the viewing angle control polarizing plates of Examples 1 to 5 and Comparative Examples 2 and 3 were not broken or deformed. Meanwhile, in the louver film of Comparative Example 1, a trace of deformation remained in the bent portion. In addition, the louver film was partially damaged.

EXPLANATION OF REFERENCES

10: first polarizer
11: absorption axis of first polarizer

20: second polarizer
21: absorption axis of second polarizer
31: tilt direction of main axis of refractive index of optically anisotropic layer
100, 101: viewing angle control system of related art
102, 103: viewing angle control system of present invention
300, 301: optically anisotropic layer
302: optically anisotropic layer containing rod-like liquid crystal compound
303: optically anisotropic layer containing disk-like liquid crystal compound
400: visual line direction in which light is not shielded
401: visual line direction in which light is shielded
500, 501: viewing angle control polarizing plate
600: rod-like liquid crystal compound
601: disk-like liquid crystal compound
700: base material
800: analyzer
801: absorption axis
810: polarizer
811: absorption axis

What is claimed is:

1. A viewing angle control system comprising at least:
a first polarizer;
an optically anisotropic layer; and
a second polarizer in this order,
wherein an absorption axis of the first polarizer forms an angle of 45° or greater with respect to a main surface,
a main axis of a refractive index of the optically anisotropic layer is tilted with respect to the main surface, and
the second polarizer has an absorption axis in an in-plane direction of the main surface.

2. The viewing angle control system according to claim 1, wherein the absorption axis of the first polarizer is perpendicular to the surface of the viewing angle control system.

3. The viewing angle control system according to claim 1, wherein the optically anisotropic layer includes a liquid crystal cured layer in which alignment is fixed in uniform tilt alignment in a thickness direction.

4. The viewing angle control system according to claim 1, wherein the optically anisotropic layer includes a liquid crystal cured layer in which alignment is fixed in hybrid alignment.

5. The viewing angle control system according to claim 1, wherein the optically anisotropic layer includes a liquid crystal cured layer in which alignment is fixed in uniform tilt alignment in a thickness direction and a liquid crystal cured layer in which alignment is fixed in hybrid alignment.

6. The viewing angle control system according to claim 1, wherein the optically anisotropic layer consists of the liquid crystal cured layer,
the liquid crystal cured layer is formed of a polymerizable liquid crystal composition containing a rod-like liquid crystal compound, and
an average tilt angle of the main axis in which the refractive index is maximized is in a range of 5° to 85° with respect to the surface.

7. The viewing angle control system according to claim 1, wherein the optically anisotropic layer consists of the liquid crystal cured layer,
the liquid crystal cured layer is formed of a polymerizable liquid crystal composition containing a disk-like liquid crystal compound, and an average tilt angle of the main axis in which the refractive index is minimized is in a range of 5° to 85° with respect to the surface.

8. The viewing angle control system according to claim 1, wherein the optically anisotropic layer consists of the liquid crystal cured layer,
wherein the liquid crystal cured layer is configured such that a product $\Delta nd$ of a refractive index anisotropy $\Delta n$ and a film thickness d is greater than 60 nm.

9. An image display device comprising:
the viewing angle control system according to claim 1.

10. The viewing angle control system according to claim 2,
wherein the optically anisotropic layer includes a liquid crystal cured layer in which alignment is fixed in uniform tilt alignment in a thickness direction.

11. The viewing angle control system according to claim 2,
wherein the optically anisotropic layer includes a liquid crystal cured layer in which alignment is fixed in hybrid alignment.

12. The viewing angle control system according to claim 2,
wherein the optically anisotropic layer includes a liquid crystal cured layer in which alignment is fixed in uniform tilt alignment in a thickness direction and a liquid crystal cured layer in which alignment is fixed in hybrid alignment.

13. The viewing angle control system according to claim 2,
wherein the optically anisotropic layer consists of the liquid crystal cured layer,
the liquid crystal cured layer is formed of a polymerizable liquid crystal composition containing a rod-like liquid crystal compound, and
an average tilt angle of the main axis in which the refractive index is maximized is in a range of 5° to 85° with respect to the surface.

14. The viewing angle control system according to claim 2,
wherein the optically anisotropic layer consists of the liquid crystal cured layer,
the liquid crystal cured layer is formed of a polymerizable liquid crystal composition containing a disk-like liquid crystal compound, and an average tilt angle of the main axis in which the refractive index is minimized is in a range of 5° to 85° with respect to the surface.

15. The viewing angle control system according to claim 2,
wherein the optically anisotropic layer consists of the liquid crystal cured layer,
wherein the liquid crystal cured layer is configured such that a product $\Delta nd$ of a refractive index anisotropy $\Delta n$ and a film thickness d is greater than 60 nm.

16. An image display device comprising:
the viewing angle control system according to claim 2.

17. The viewing angle control system according to claim 3,
wherein the optically anisotropic layer consists of the liquid crystal cured layer,
the liquid crystal cured layer is formed of a polymerizable liquid crystal composition containing a rod-like liquid crystal compound, and
an average tilt angle of the main axis in which the refractive index is maximized is in a range of 5° to 85° with respect to the surface.

18. The viewing angle control system according to claim 3, wherein the optically anisotropic layer consists of the liquid crystal cured layer, the liquid crystal cured layer is formed of a polymerizable liquid crystal composition containing a disk-like liquid crystal compound, and an average tilt angle of the main axis in which the refractive index is minimized is in a range of 5° to 85° with respect to the surface.

19. The viewing angle control system according to claim 3, wherein the optically anisotropic layer consists of the liquid crystal cured layer, wherein the liquid crystal cured layer is configured such that a product Δnd of a refractive index anisotropy Δn and a film thickness d is greater than 60 nm.

20. An image display device comprising:

the viewing angle control system according to claim 3.

* * * * *